United States Patent
Sukekawa

(10) Patent No.: US 11,785,781 B2
(45) Date of Patent: Oct. 10, 2023

(54) INTEGRATED CIRCUIT CONSTRUCTIONS COMPRISING MEMORY AND METHODS USED IN THE FORMATION OF INTEGRATED CIRCUITRY COMPRISING MEMORY

(71) Applicant: Micron Technology, Inc., Boise, ID (US)

(72) Inventor: Mitsunari Sukekawa, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 116 days.

(21) Appl. No.: 17/226,524

(22) Filed: Apr. 9, 2021

(65) Prior Publication Data

US 2021/0233920 A1    Jul. 29, 2021

Related U.S. Application Data

(62) Division of application No. 15/928,410, filed on Mar. 22, 2018, now Pat. No. 11,037,940.

(51) Int. Cl.
*H01L 27/11507* (2017.01)
*H10B 53/30* (2023.01)
(Continued)

(52) U.S. Cl.
CPC .............. *H10B 53/30* (2023.02); *H01L 28/60* (2013.01); *H10B 53/40* (2023.02)

(58) Field of Classification Search
None
See application file for complete search history.

(56) References Cited

U.S. PATENT DOCUMENTS 4,990,980 A    2/1991 Wada
7,449,391 B2    11/2008 Manning et al.
(Continued)

FOREIGN PATENT DOCUMENTS

CN    101803024    8/2010
CN    107706190    2/2018
(Continued)

*Primary Examiner* — Joseph C. Nicely
*Assistant Examiner* — Lamont B Koo
(74) *Attorney, Agent, or Firm* — Wells St. John P.S.

(57) ABSTRACT

An integrated circuit construction comprising memory comprises two memory-cell-array regions having a peripheral-circuitry region laterally there-between in a vertical cross-section. The two memory-cell-array regions individually comprise a plurality of capacitors individually comprising a capacitor storage node electrode, a shared capacitor electrode that is shared by the plurality of capacitors, and a capacitor insulator there-between. A laterally-extending insulator structure is about lateral peripheries of the capacitor storage node electrodes and is vertically spaced from a top and a bottom of individual of the capacitor storage node electrodes in the vertical cross-section. The peripheral-circuitry region in the vertical cross-section comprises a pair of elevationally-extending walls comprising a first insulative composition. A second insulative composition different from the first insulative composition is laterally between the pair of walls. The pair of walls individually have a laterally-outer side of the first insulative composition that is directly against a lateral edge of the insulator structure that is in different ones of the two array regions. Other embodiments, including methods, are disclosed.

8 Claims, 24 Drawing Sheets

(51) Int. Cl.
*H01L 49/02* (2006.01)
*H10B 53/40* (2023.01)

(56) References Cited

U.S. PATENT DOCUMENTS

| | | |
|---|---|---|
| 2003/0068867 A1 | 4/2003 | Forster et al. |
| 2009/0047769 A1 | 2/2009 | Bhat et al. |
| 2013/0093050 A1 | 4/2013 | Busch et al. |
| 2018/0047739 A1 | 2/2018 | Dorhout et al. |
| 2018/0061840 A1 | 3/2018 | Sills |

FOREIGN PATENT DOCUMENTS

| | | |
|---|---|---|
| CN | 107799523 | 3/2018 |
| DE | 10143283 | 12/2002 |
| EP | 0198590 | 10/1986 |

INTEGRATED CIRCUIT CONSTRUCTIONS COMPRISING MEMORY AND METHODS USED IN THE FORMATION OF INTEGRATED CIRCUITRY COMPRISING MEMORY

RELATED PATENT DATA

This patent resulted from a divisional application of U.S. patent application Ser. No. 15/928,410, filed Mar. 22, 2018, entitled "Integrated Circuit Constructions Comprising Memory And Methods Used In The Formation Of Integrated Circuitry Comprising Memory", naming Mitsunari Sukekawa as inventor, the disclosure of which is incorporated by reference.

TECHNICAL FIELD

Embodiments disclosed herein pertain to integrated circuit constructions comprising memory and to methods used in the formation of integrated circuitry comprising memory.

BACKGROUND

Memory is one type of integrated circuitry and is used in computer systems for storing data. Memory may be fabricated in one or more arrays of individual memory cells. Memory cells may be written to, or read from, using digit lines (which may also be referred to as bitlines, data lines, or sense lines) and access lines (which may also be referred to as wordlines). The digit lines may conductively interconnect memory cells along columns of the array, and the access lines may conductively interconnect memory cells along rows of the array. Each memory cell may be uniquely addressed through the combination of a digit line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1. In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. Depending on composition of the insulating material, that stored field will be volatile or non-volatile. For example, a capacitor insulating material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages, and remains after removal of the programming voltage (at least for a time). Each polarization state has a different charge-stored capacitance from the other, and which ideally can be used to write (i.e., store) and to read (i.e., determine) a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor.

U.S. Pat. No. 7,449,391 describes some existing methods of forming memory circuitry comprising capacitors.

DETAILED DESCRIPTION OF EXAMPLE EMBODIMENTS

Embodiments of the invention encompass methods used in the formation of integrated circuitry comprising memory, and integrated circuit constructions comprising memory independent of method of manufacture. First example method embodiments are described with reference to FIGS. 1-16.

Figure 1:
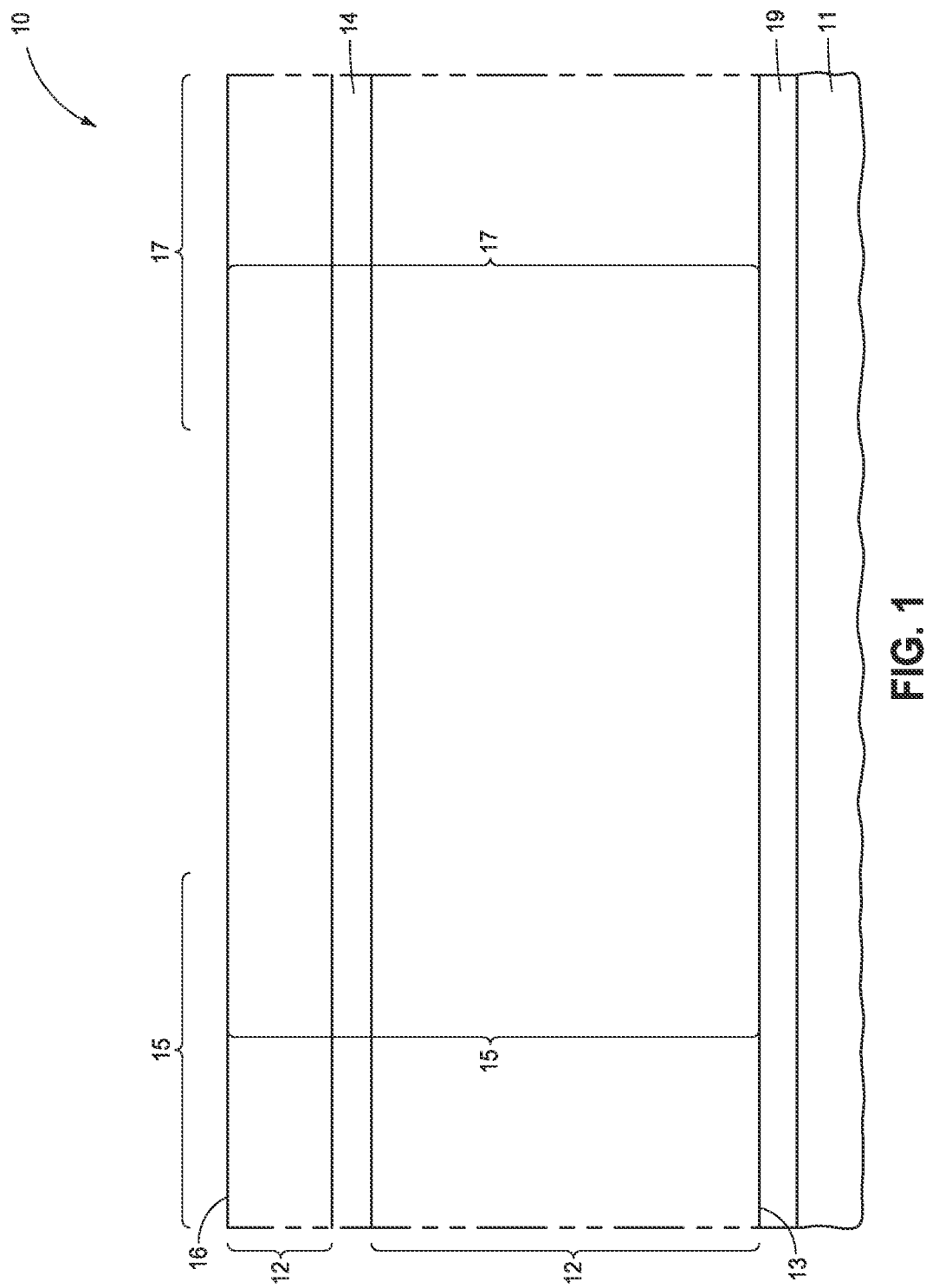
FIG. 1 is a diagrammatic cross-sectional view of a portion of a substrate construction in process in accordance with an embodiment of the invention.

Referring to FIG. 1, a substrate construction 10 in process in accordance with an embodiment of the invention is shown. A base substrate 11 thereof may include any one or more of conductive/conductor/conducting (i.e., electrically herein), semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIG. 1-depicted materials. For example, other partially or wholly fabricated components of integrated circuitry may be provided somewhere above, about, or within base substrate 11. Control and/or other peripheral circuitry for operating components within a memory array may also be fabricated, and may or may not be wholly or partially within an array or sub-array. Further, multiple sub-arrays may also be fabricated and operated independently, in tandem, or otherwise relative one another. In this document, a "sub-array" may also be considered as an array.

Sacrificial material 12 has been formed over substrate 11. A laterally-extending insulator structure 14 has been provided in sacrificial material 12 and is vertically spaced from a top 16 and a bottom 13 of sacrificial material 12 in a vertical cross-section (e.g., the vertical cross-section that may be considered as the plane-of-the-page upon which FIG. 1 lies). An example composition of insulator structure 14 is silicon nitride. An optional non-sacrificial material 19 is shown between substrate 11 and sacrificial material 12. Materials/structures 19, 12, 14, and 12 may be formed by successive depositions. Sacrificial material 12 above and below insulator structure 14 may be of the same or different composition relative one another, with one example being doped or undoped silicon dioxide. Non-sacrificial material 19 may, by way of example, be of the same composition as insulator structure 14 or of different composition. Example thicknesses for each of insulator structure 14 and material 19 are 50 nanometers (nm), with example thicknesses for material 12 above and below insulator structure 14 being 300 nm and 700 nm, respectively. Sacrificial material 12 and insulator structure 14 may be considered as comprising two laterally-outer parts 15 and 17 in the vertical cross-section.

Figure 2:
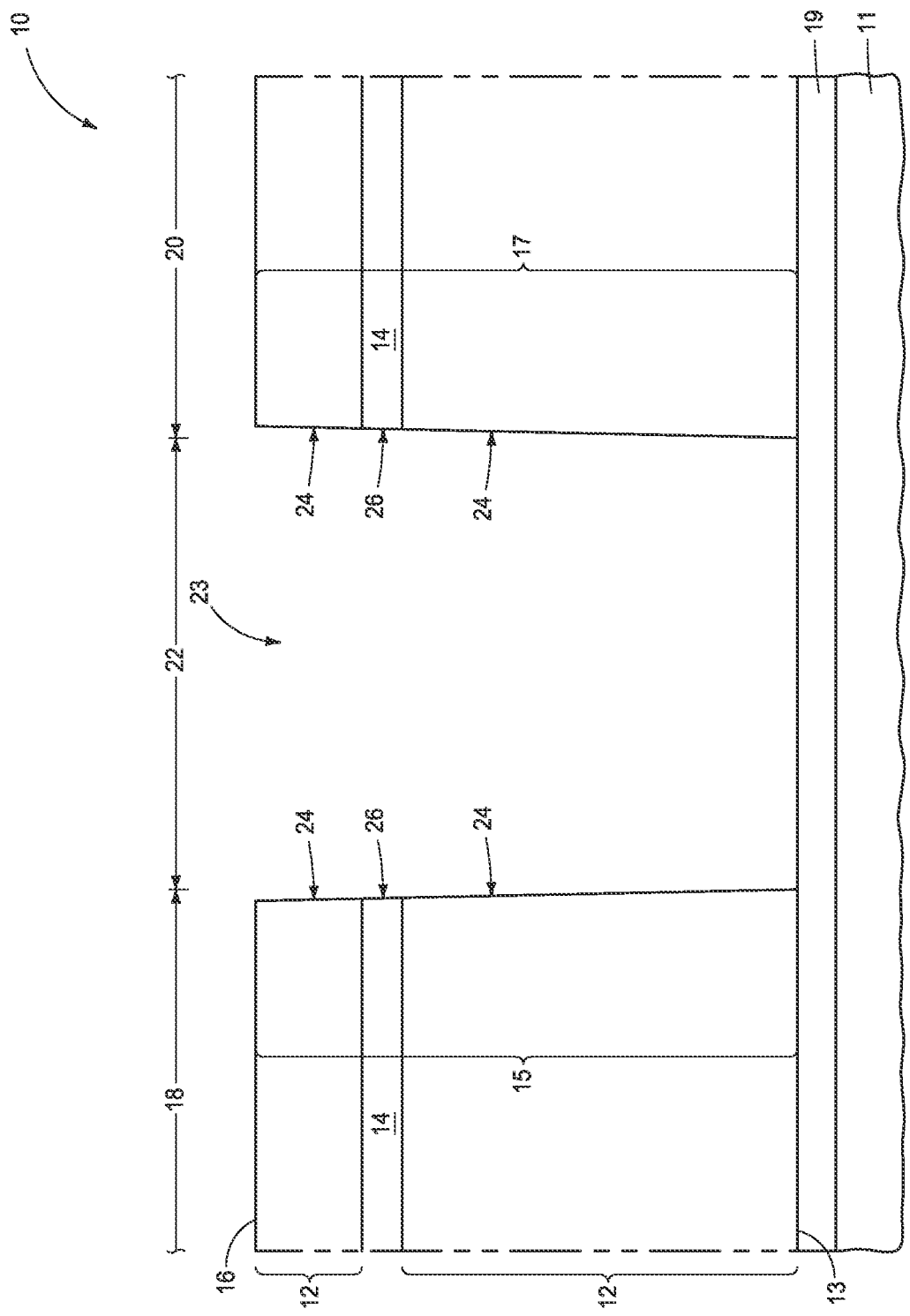
FIG. 2 is a view of the FIG. 1 construction at a processing step subsequent to that shown by FIG. 1.

Referring to FIG. 2, at least some of sacrificial material 12 and insulator structure 14 have been removed (e.g., by photolithographic patterning and dry anisotropic etching) from laterally between two laterally-outer parts 15 and 17 in the vertical cross-section to form a laterally-intermediate region 22 that is laterally between two laterally-outer regions 18 and 20 that comprise sacrificial material 12 and insulator structure 14 in the vertical cross-section. An example opening 23 has been formed thereby. In some embodiments, laterally-outer regions 18 and 20 may be considered as memory-cell-array regions and laterally-intermediate region 22 may be considered as a peripheral-circuitry region that is laterally there-between in the vertical cross-section. Regardless, sacrificial material 12 may be considered as having a lateral side 24 in different ones of laterally-outer regions 18, 20, and insulator structure 14 may be considered as having a lateral edge 26 in such different ones of laterally-outer regions 18, 20 in the vertical cross-section.

Figure 3:
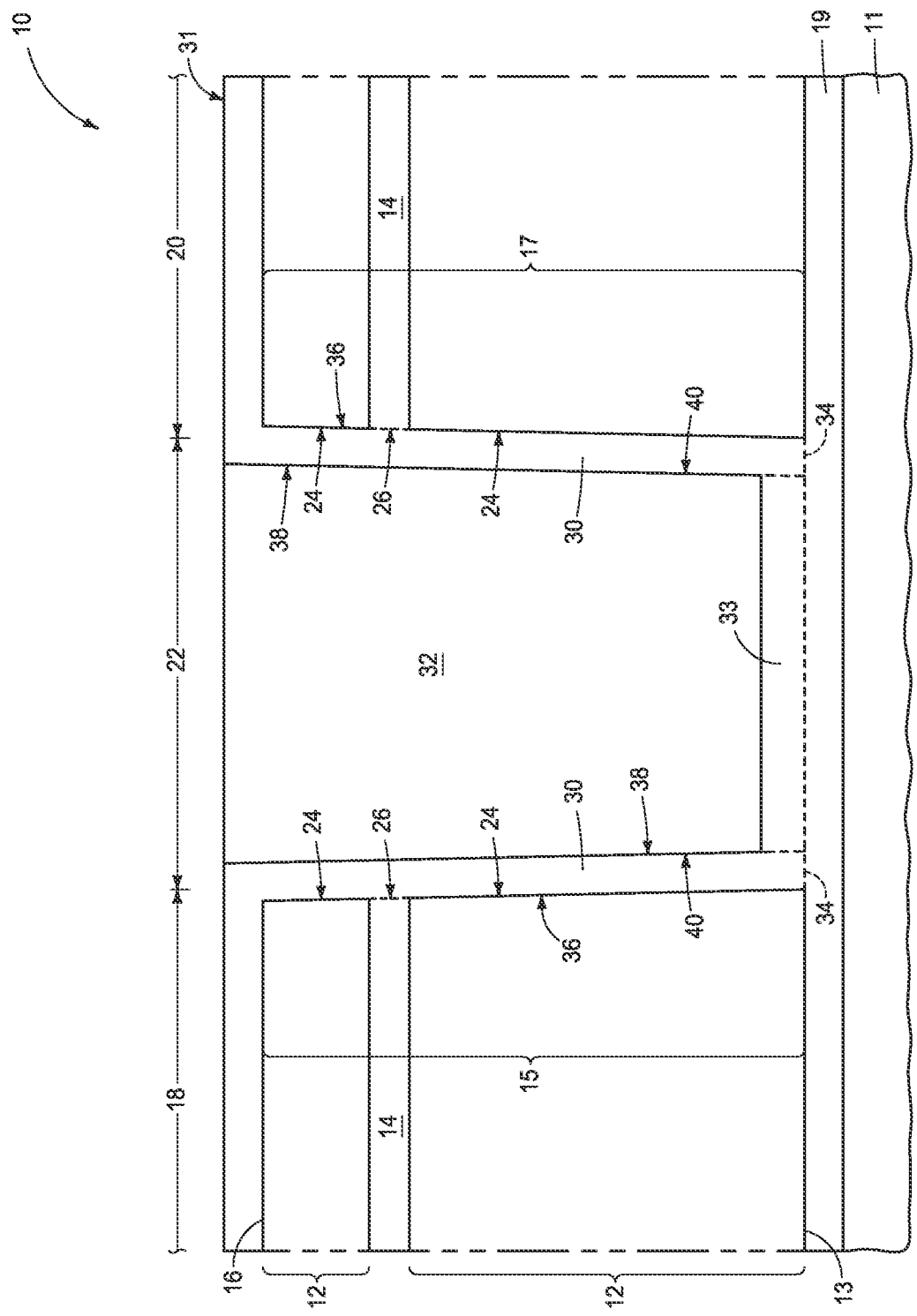
FIG. 3 is a view of the FIG. 2 construction at a processing step subsequent to that shown by FIG. 2.

Referring to FIG. 3, a pair of elevationally-extending walls 30 has been formed in laterally-intermediate region 22 and that individually are against, in one embodiment directly against, lateral sides 24 of sacrificial material 12 of laterally-outer regions 18, 20 in the vertical cross-section. In one embodiment and as shown, individual walls 30 are directly against lateral edges 26 of insulator structure 14 of laterally-outer regions 18, 20 in the vertical cross-section. Sacrificial material 12 comprises one composition (e.g., silicon dioxide as stated above) and pair of walls 30 comprises another composition (e.g., silicon nitride) that is different from the one composition, with the another composition being insulative. Walls 30 may be formed by conformal deposition of a layer 31 as-shown, with an example thickness being 50 nm. Thereafter, in one embodiment, insulative material 32 may be formed in laterally-intermediate region 22 laterally between walls 30 in the vertical cross-section. Insulative material 32 may be of the same composition as sacrificial material 12, although may not itself be sacrificial. Pair of walls 30 may be considered as comprising bottoms 34, with layer 31 that is laterally there-between comprising a layer (e.g., 33, and which is part of layer 31) of the another composition that extends from one of walls 30 to the other proximate bottoms 34. In some embodiments, walls 30 may be considered as individually having a laterally-outer side 36 of a first insulative composition and a laterally-inner side 38 of the first insulative composition. Further in at least some of such embodiments, material 32 may be considered as being of a second insulative composition having two laterally-outer sides 40 of the second insulative composition. Insulative material 32 may be formed by any suitable deposition technique followed by planarizing it back at least to an elevationally-outermost surface of layer 31.

Figure 4:
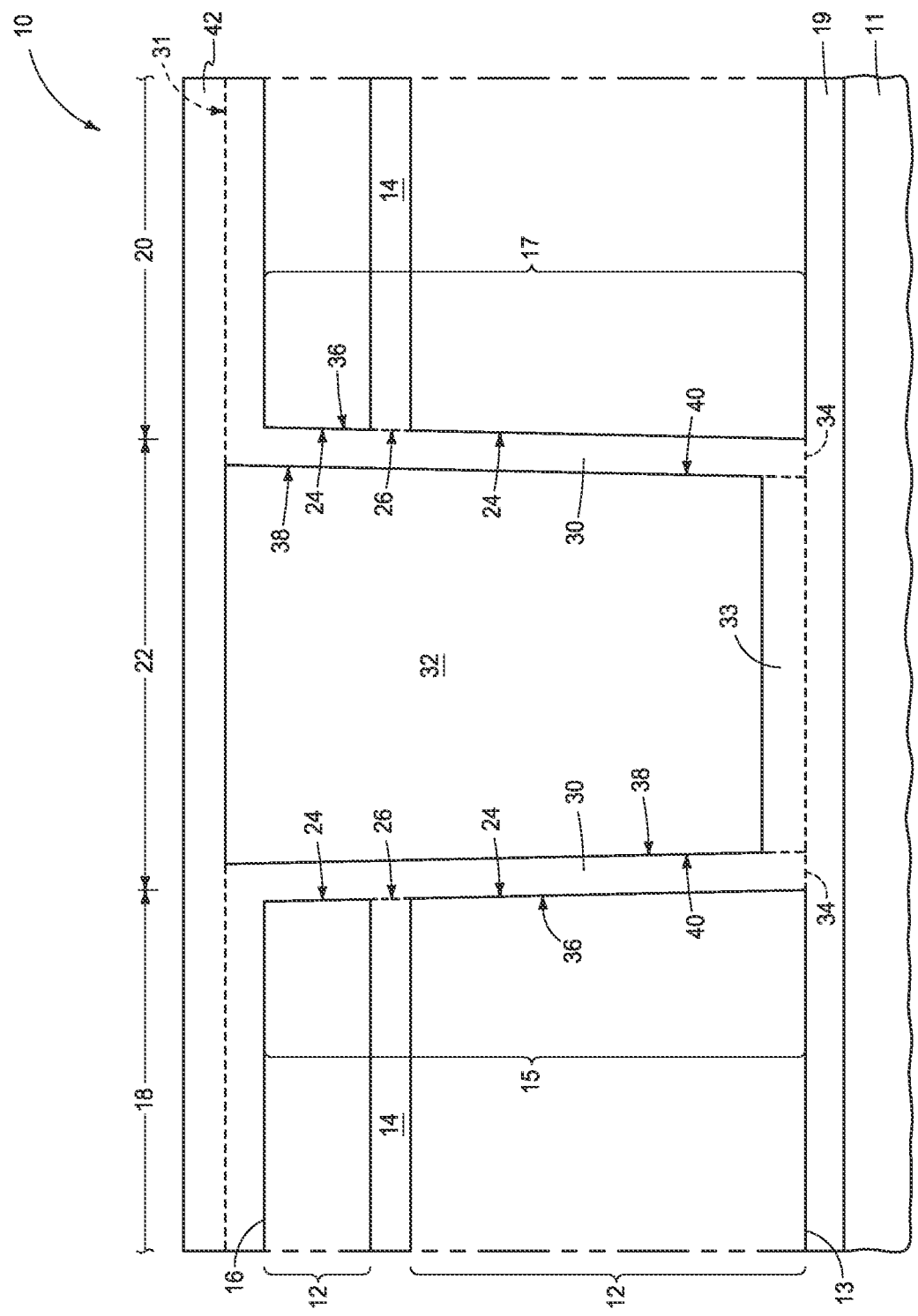
FIG. 4 is a view of the FIG. 3 construction at a processing step subsequent to that shown by FIG. 3.

FIG. 4 shows example subsequent processing wherein another insulative material layer 42 has been formed atop the construction of FIG. 3, for example as may be used to preclude etching of insulative material 32 from the top thereof during etching of sacrificial material 12 (as described below). By way of example only, such is shown by dashed lines to be of the same composition as wall layer 31 and as having been deposited to the same thickness.

Figure 5:
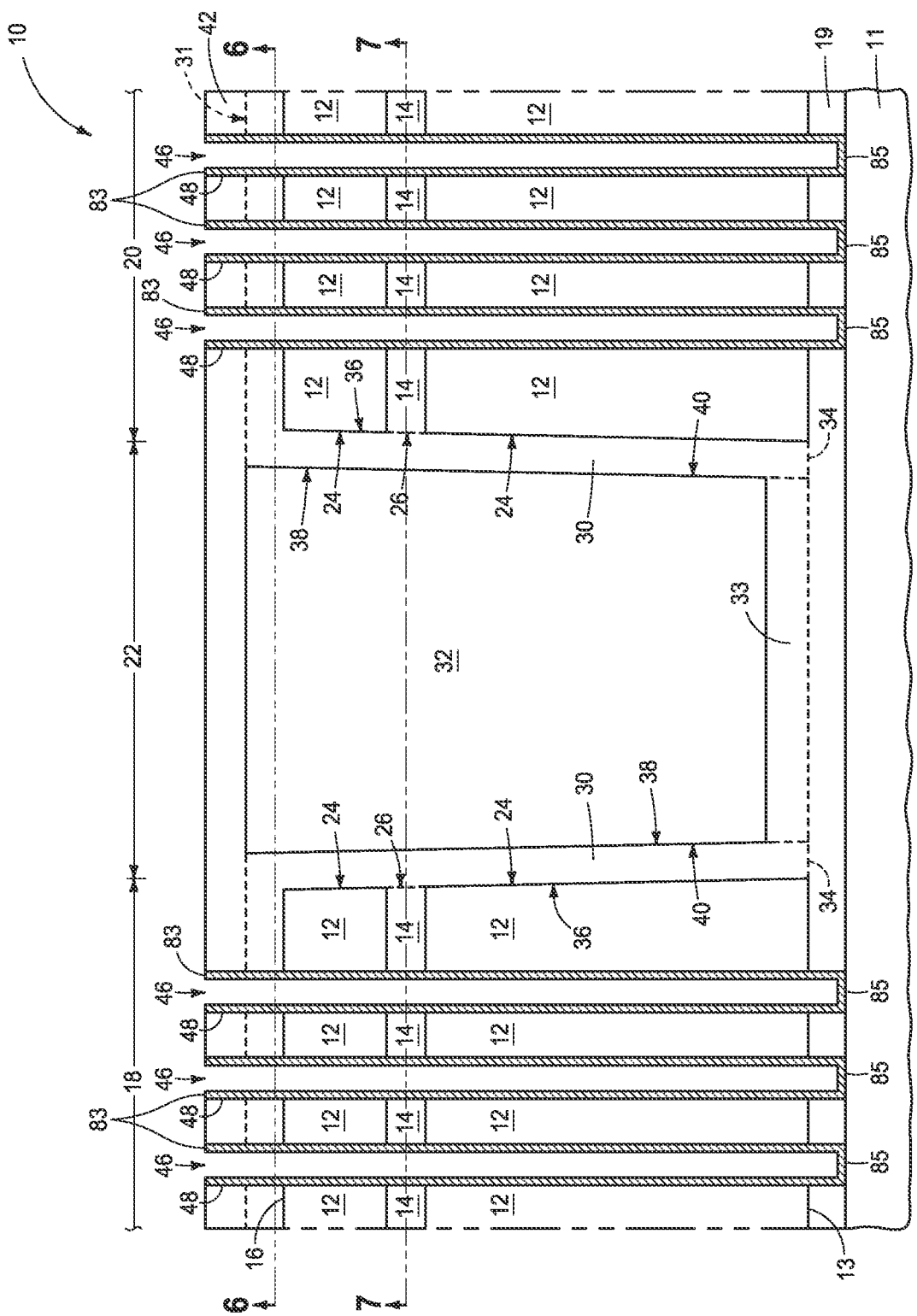
FIG. 5 is a view of the FIG. 4 construction at a processing step subsequent to that shown by FIG. 4, and is taken through line 5-5 in FIGS. 6 and 7.
Figure 6:
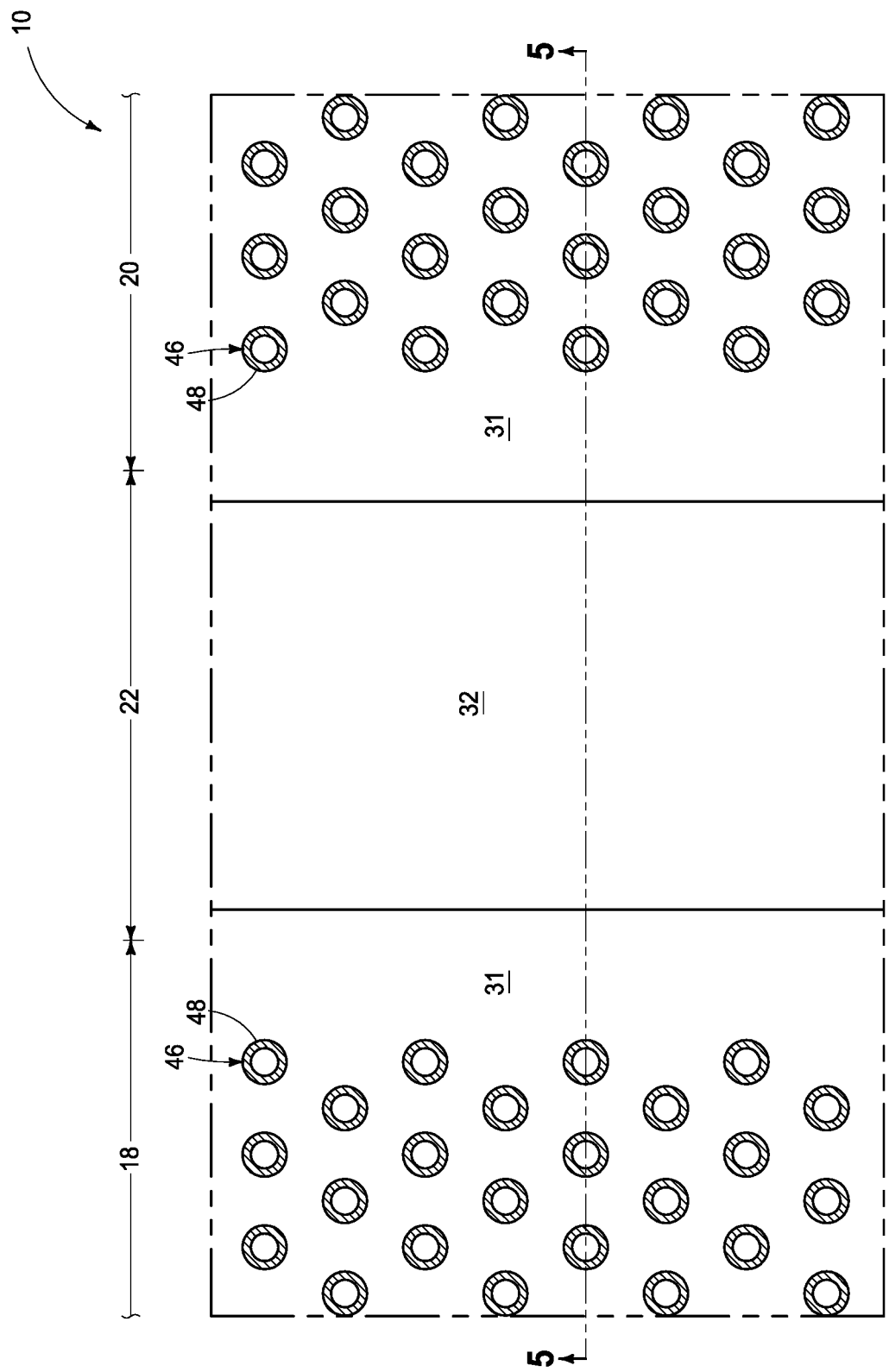
FIG. 6 is a sectional view taken through line 6-6 in FIG. 5.
Figure 7:
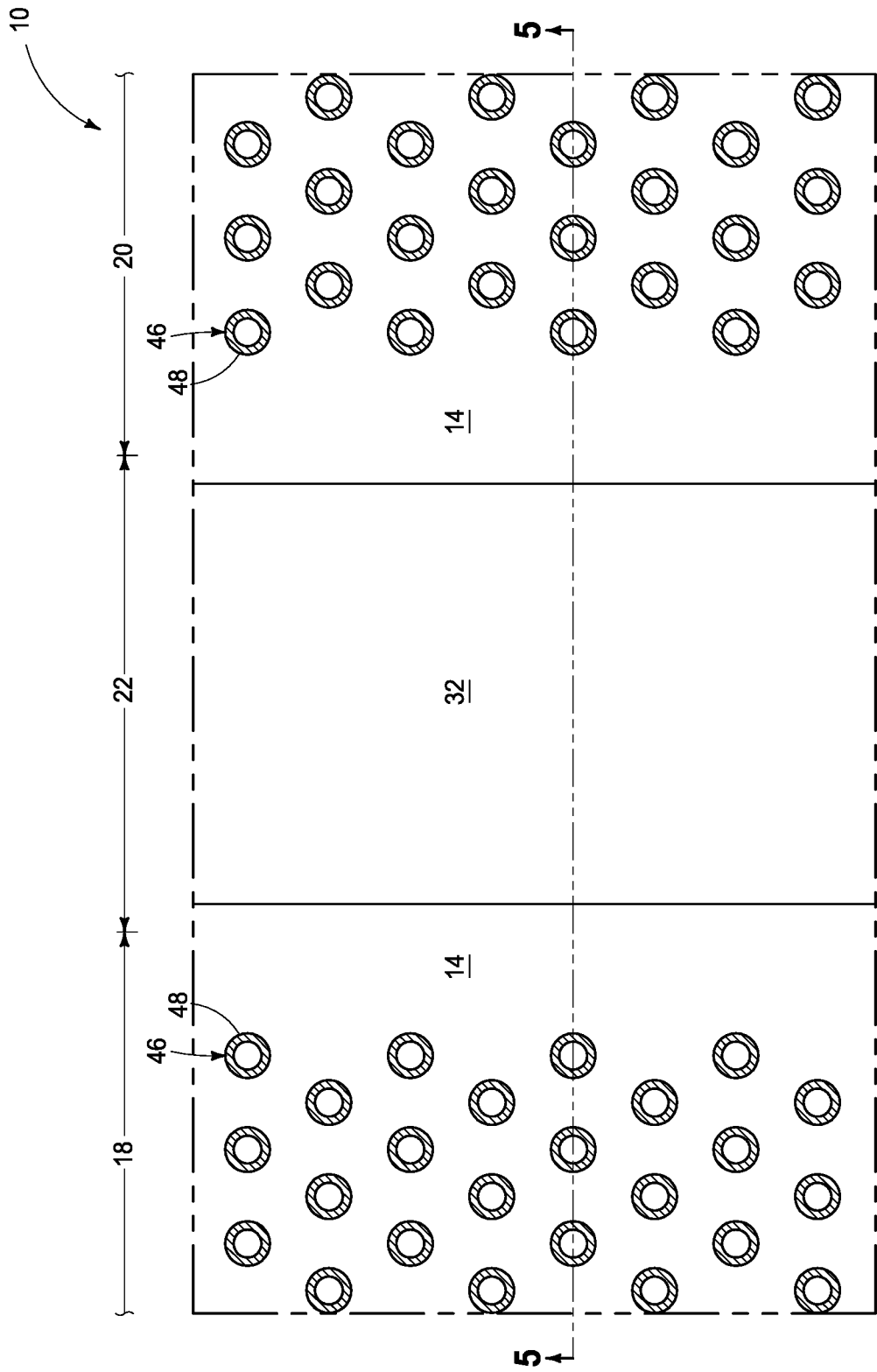
FIG. 7 is a sectional view taken through line 7-7 in FIG. 5.

Referring to FIGS. 5-7, and after forming walls 30, elevationally-extending openings 46 have been formed into sacrificial material 12 and through insulator structure 14 in each of laterally-outer regions 18, 20, and in one embodiment including through material 19. Capacitor storage node electrodes 48 have then been formed in openings 46 in each of laterally-outer regions 18, 20. Openings 46, by way of example, may be formed by photolithographic patterning and etch, and an example material for capacitor storage node electrodes 48 is titanium nitride. Capacitor storage node electrodes 48 may be formed by depositing a thin conformal layer of titanium nitride as shown, followed by planarizing such layer back at least to an elevationally-outermost surface of material 42. Capacitor storage node electrodes 48 may be considered individually as having a top 83 and a bottom 85. In one embodiment and as shown, insulative material 32 is formed before forming capacitor storage node electrodes 48. FIGS. 5-7 show but one example array layout of openings 46 and electrodes 48 therein relative one another, and of course other existing or yet-to-be-developed layouts may be used.

Figure 8:
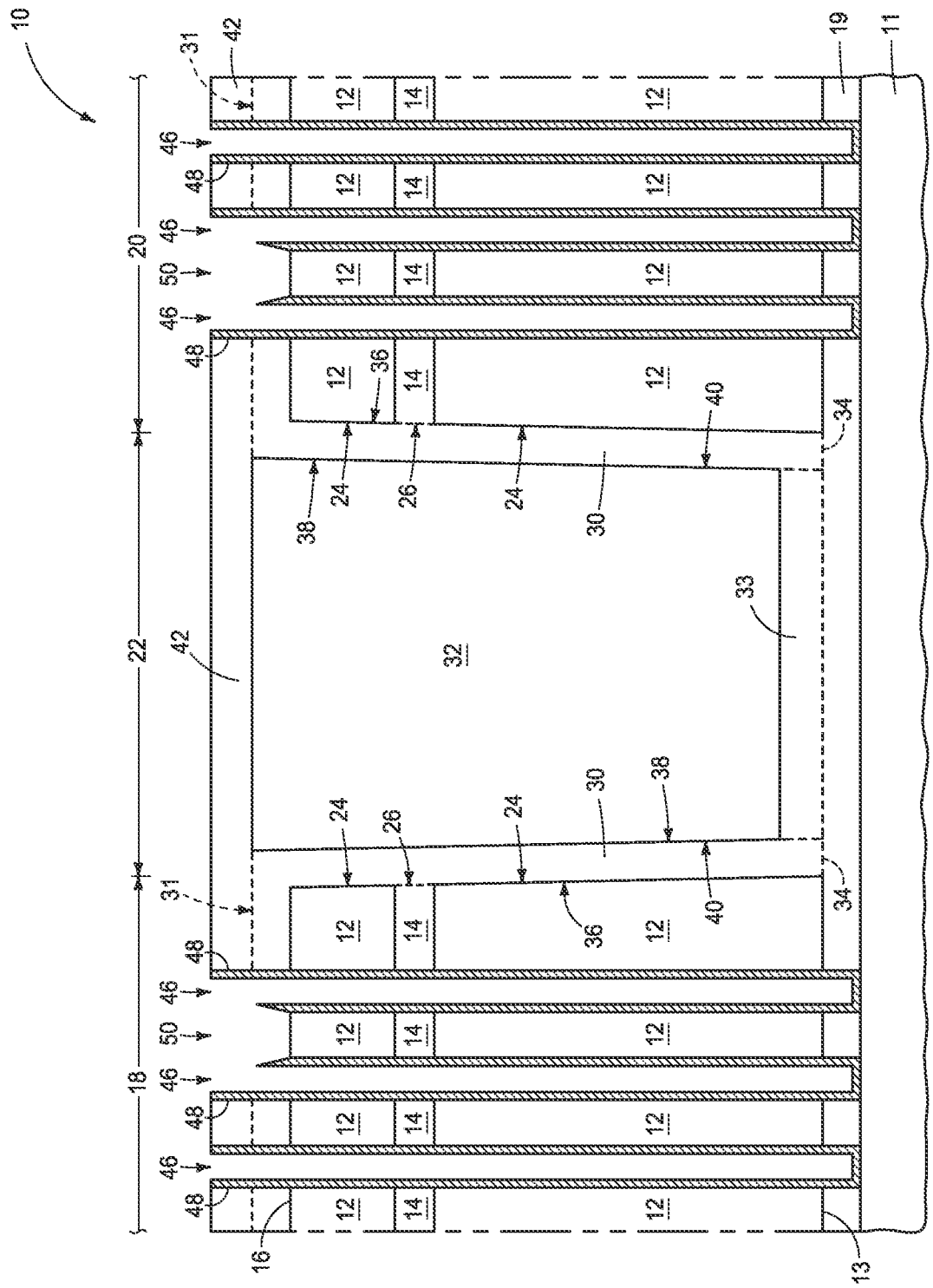
FIG. 8 is a view of the FIG. 5 construction at a processing step subsequent to that shown by FIG. 5.

Referring to FIG. 8, openings 50 have been formed through materials 42 and layer 31 to upper sacrificial material 12. Example upper portions of titanium nitride of capacitor storage node electrodes 48 within openings 50 may also be partially removed as shown. Openings 50 may be formed, by way of example, by photolithographic patterning and etch, and may provide access of an etching fluid to sacrificial material 12. For example, FIGS. 9-11 in comparison to FIG. 8 shows removal (e.g., by isotropic wet etching) of upper sacrificial material 12 (not shown in FIG. 9). This may be followed by anisotropic etching of insulator structure 14 through openings 50 (e.g., effectively using layers 42 and 31 as a masking material during such etching) as shown, which will then expose lower sacrificial material 12 (not shown in FIG. 9). Then, lower sacrificial material 12 may be removed (e.g., by isotropic wet etching selectively relative to material of structure 14 and layer 42 as shown). Such essentially leaves void space 45 in volume previously occupied by sacrificial material 12.

Figure 12:
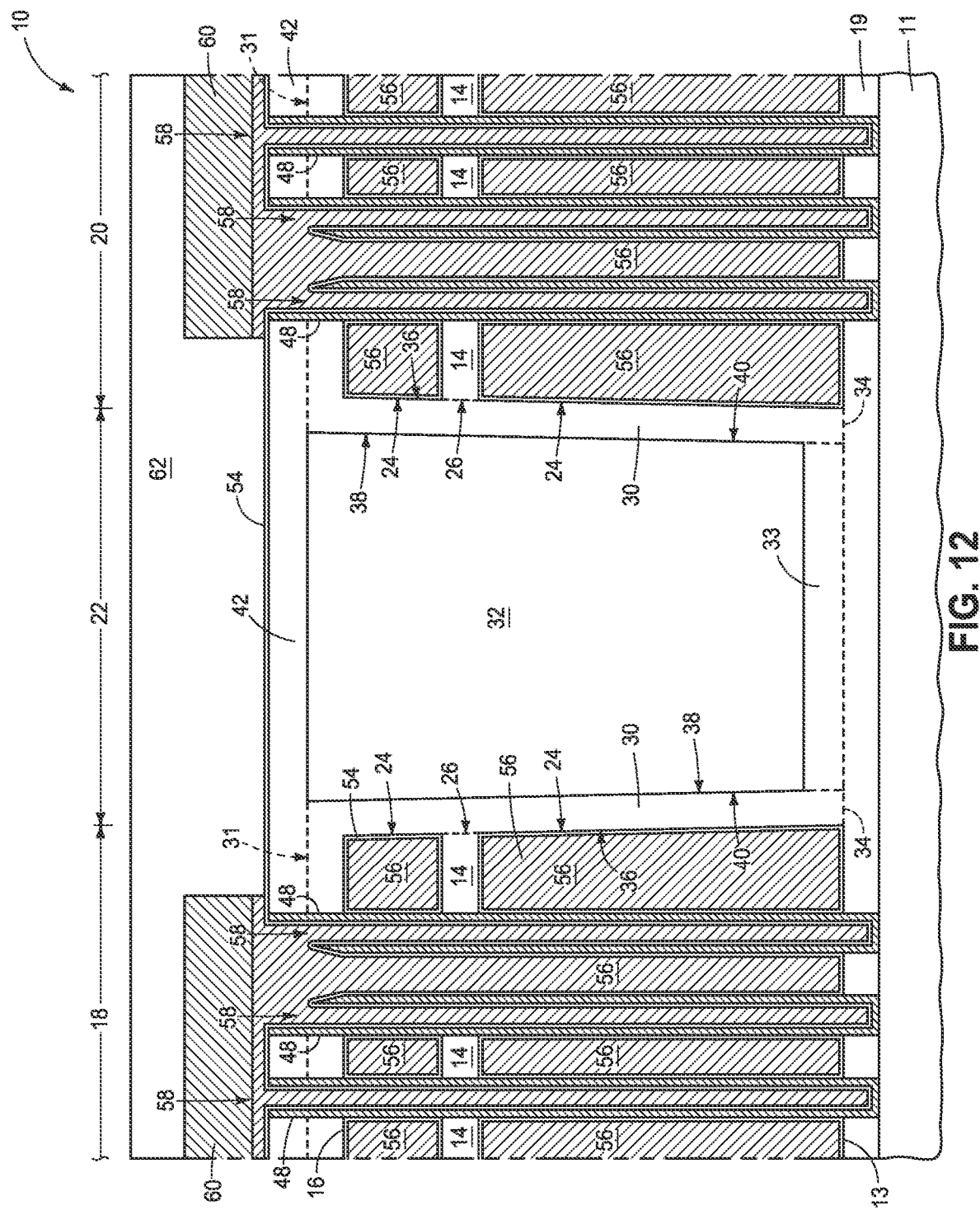
FIG. 12 is a view of the FIG. 9 construction at a processing step subsequent to that shown by FIG. 9.

Referring to FIG. 12, capacitor insulator 54 (e.g., one or more of silicon dioxide, silicon nitride, aluminum dioxide, hafnium oxide, etc.) and a shared capacitor electrode 56 (e.g., titanium nitride) have been formed over capacitor storage node electrodes 48 in each of laterally-outer regions 18, 20 to form a plurality of capacitors 58 in each laterally-outer region 18, 20. Example conductive material 60 (e.g., metal material) has been formed atop conductive material of shared capacitor electrode 56 to form a part thereof, with such combined example conductive materials then having been patterned for example as shown, followed by formation of an insulator material 62 (e.g., silicon dioxide). Accordingly, some embodiments comprise, after forming the storage node electrodes, removing at least some (in one embodiment most, and in one embodiment all as shown) of the sacrificial material from each of the two laterally-outer regions and then forming a capacitor insulator and a shared capacitor electrode over the storage node electrodes in each of the two laterally-outer regions to form a plurality of capacitors in each of the two laterally-outer regions.

In one embodiment, sacrificial material 12 is insulative and insulative material 32 is formed of a composition that is the same as that of sacrificial material 12. Regardless, yet in one such embodiment, the removing of at least some of sacrificial material 12 from each of two laterally-outer regions 18, 20 comprises chemical etching, with the pair of walls 30 functioning as an etch stop to lateral etching of insulative material 32 during such chemical etching. In one embodiment, insulative material 32 is substantially chemically homogenous.

Figure 13:
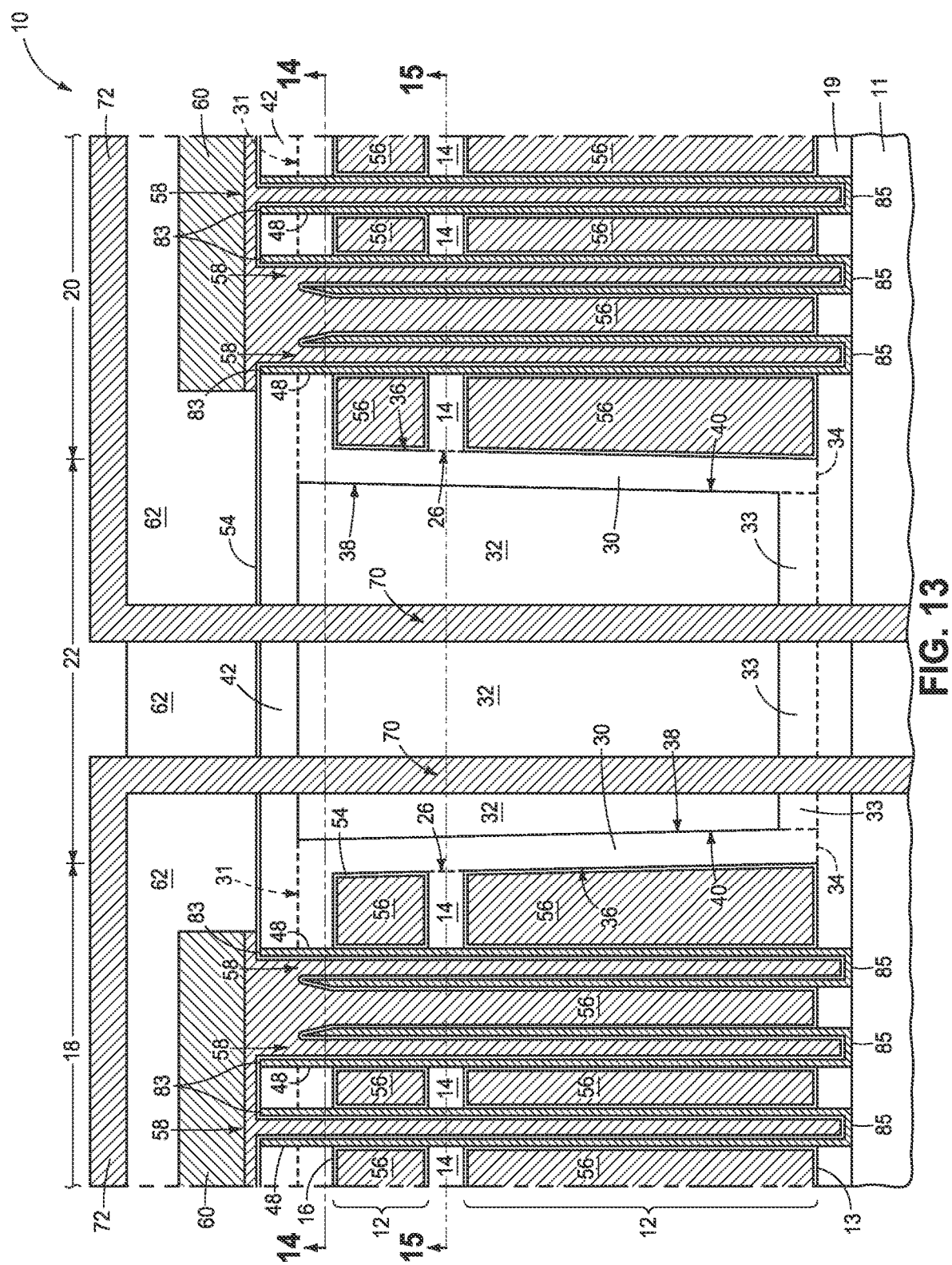
FIG. 13 is a view of the FIG. 12 construction at a processing step subsequent to that shown by FIG. 12, and is taken through line 13-13 in FIGS. 14 and 15.
Figure 14:
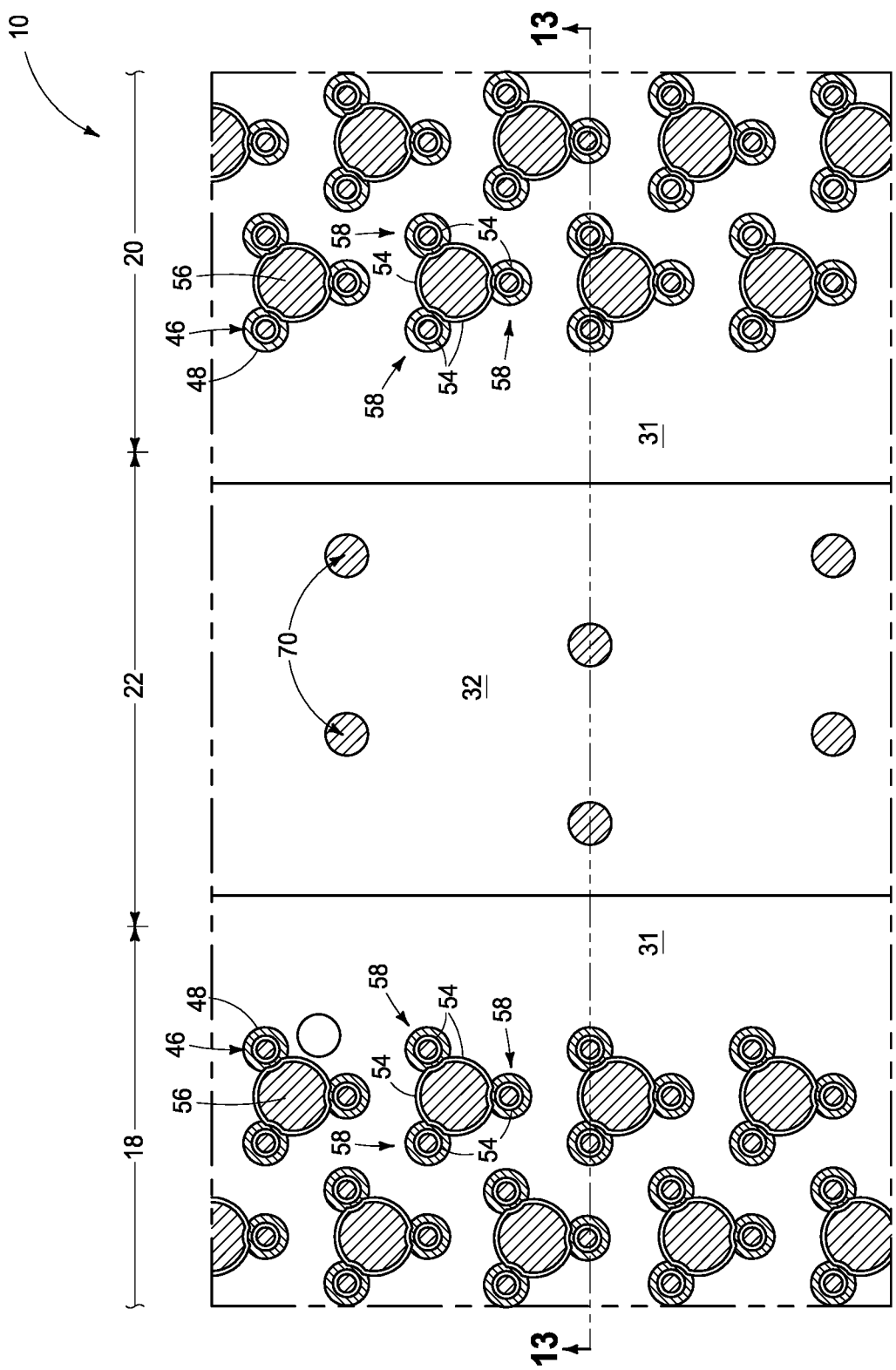
FIG. 14 is a sectional view taken through line 14-14 in FIG. 13.
Figure 15:
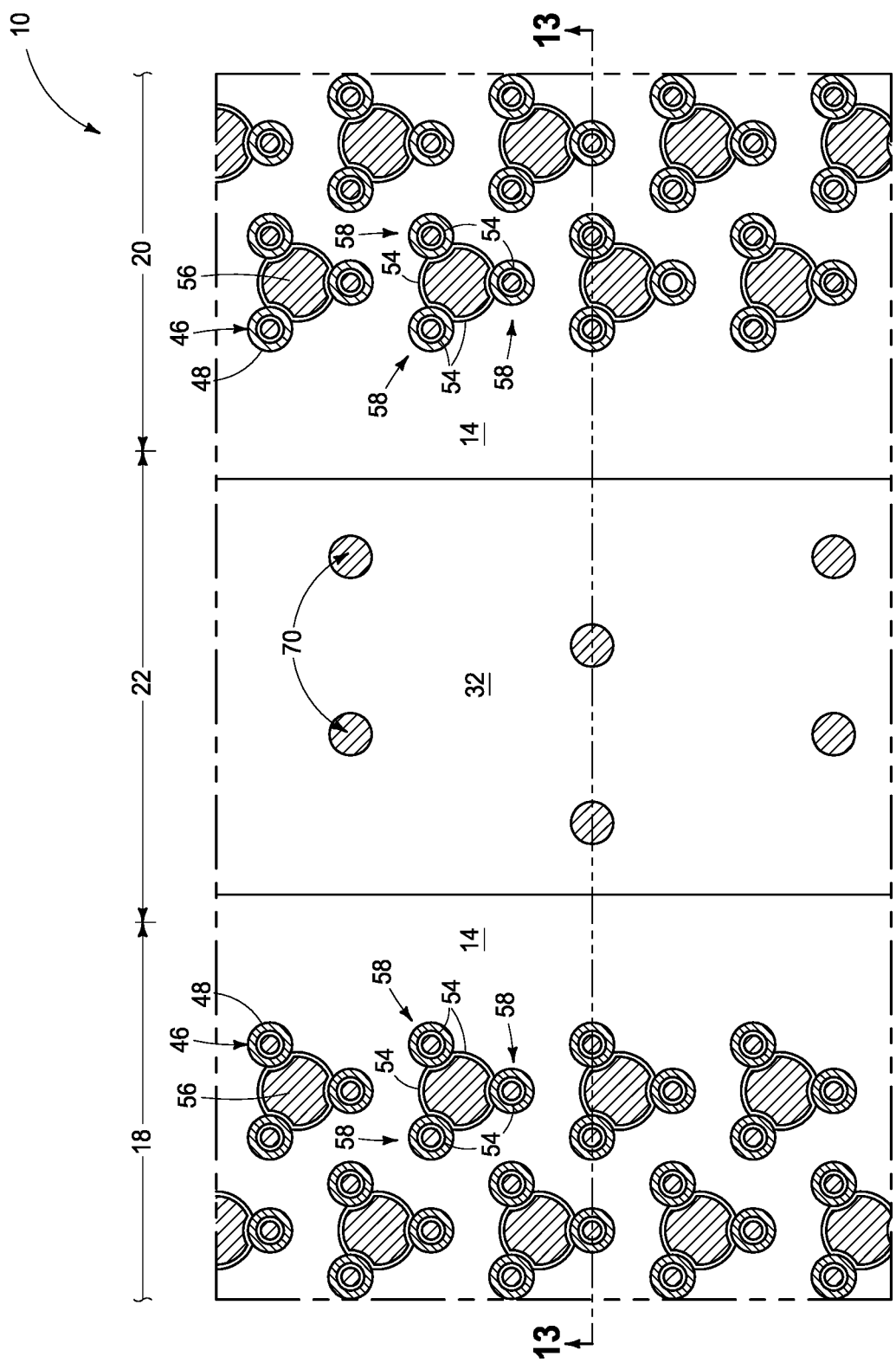
FIG. 15 is a sectional view taken through line 15-15 in FIG. 13.

Referring to FIGS. 13-15, conductive vias 70 have been formed elevationally through insulative material 32 in laterally-intermediate region 22. Such may, for example, extend to wordline extensions (not shown) of transistors (not shown) and bitline extensions (not shown) that extend from regions 18 and 20 into region 22 below capacitors 58. Conductive vias 70 are shown extending to and directly electrically coupled with conductive lines 72 above insulating material 62. In some embodiments and as shown, structures that extend elevationally are vertical or within 10° of vertical.

Figure 16:
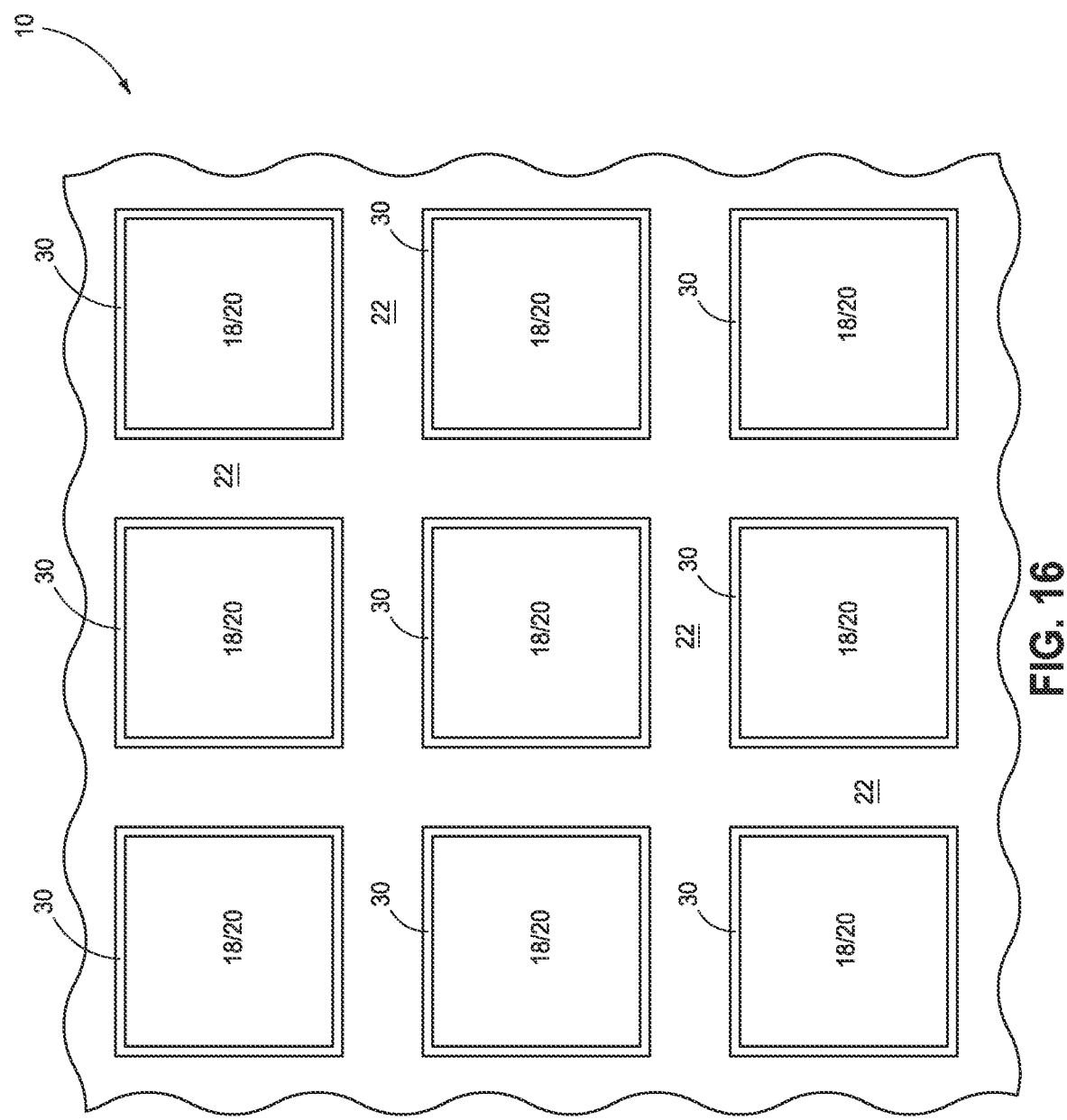
FIG. 16 is a diagrammatic reduced-scale top and enlarged view of the FIGS. 13-15 construction.

FIG. 16 by way of example shows array or sub-array regions 18/20 having walls 30 received there-about, and with laterally-intermediate/peripheral-circuitry regions 22 there-between.

Figure 17:
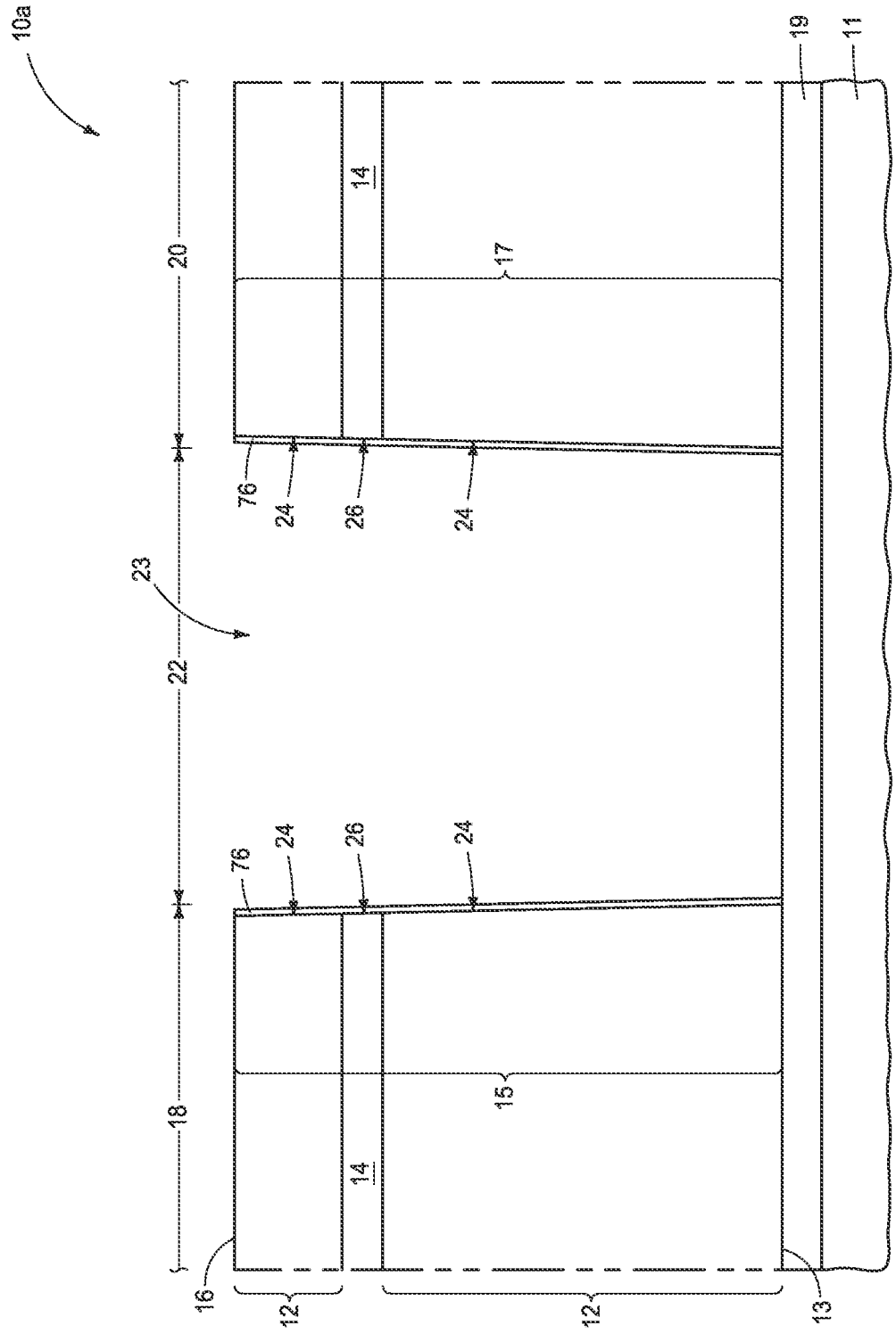
FIG. 17 is a diagrammatic cross-sectional view of a portion of a substrate construction in process in accordance with an embodiment of the invention.

Another example method used in the formation of integrated circuitry that comprises memory is next described with reference to FIGS. 17-19. Like numerals from the above-described embodiments have been used where appropriate, with some construction differences being indicated with the suffix "a" or with different numerals. FIG. 17 shows processing that may occur subsequent to that shown by FIG. 2. A material 76 has been formed laterally over lateral edge 26, in one embodiment directly there-against, of insulator structure 14 that is in different ones of two laterally-outer regions 18, 20 in the vertical cross-section. Material 76 is formed before forming walls 30 (walls 30 not being shown in FIG. 17) and is of different composition from that of walls 30 that are subsequently formed. An example lateral thickness for material 76 is from about 10 nm to 100 nm. In some embodiments, material 76 remains in a finished circuitry construction, and in some other embodiments material 76 does not remain in a finished circuitry construction (i.e., it is all removed). Regardless, in one embodiment material 76 is of the same composition as that of sacrificial material 12, and in another embodiment is of different composition from that of sacrificial material 12. Regardless, in one embodiment and as shown, material 76 is formed elevationally all along laterally-opposing sides 24, 26 of opening 23 in laterally-intermediate region 22. Regardless, in one embodiment material 76 is insulative. An example method of forming material 76 is by depositing a conformal layer thereof over substrate 10 of FIG. 2, followed by mask-less dry anisotropic etching thereof to substantially remove such from being over horizontal surfaces as shown.

Figure 9:
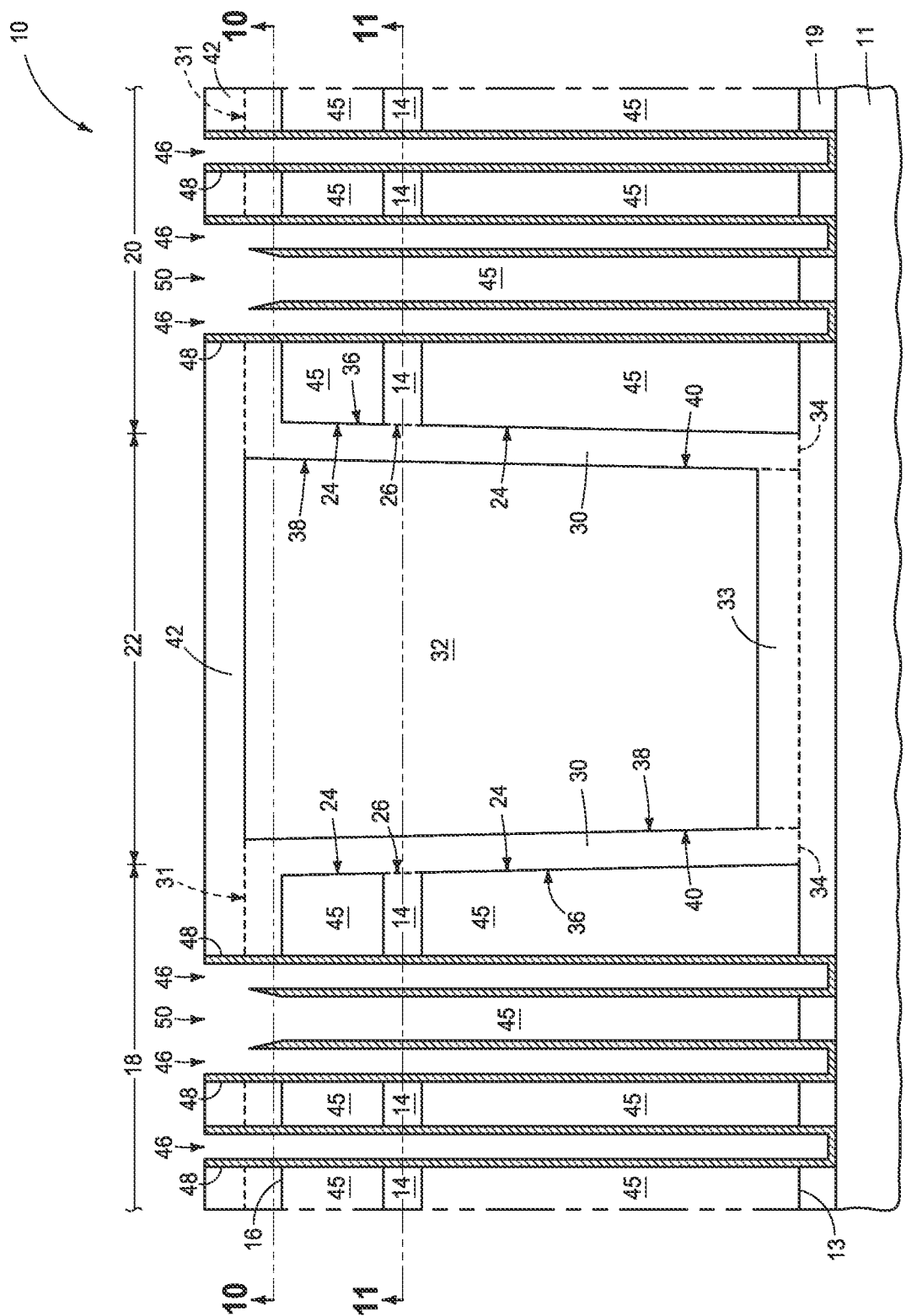
FIG. 9 is a view of the FIG. 8 construction at a processing step subsequent to that shown by FIG. 8, and is taken through line 9-9 in FIGS. 10 and 11.
Figure 10:
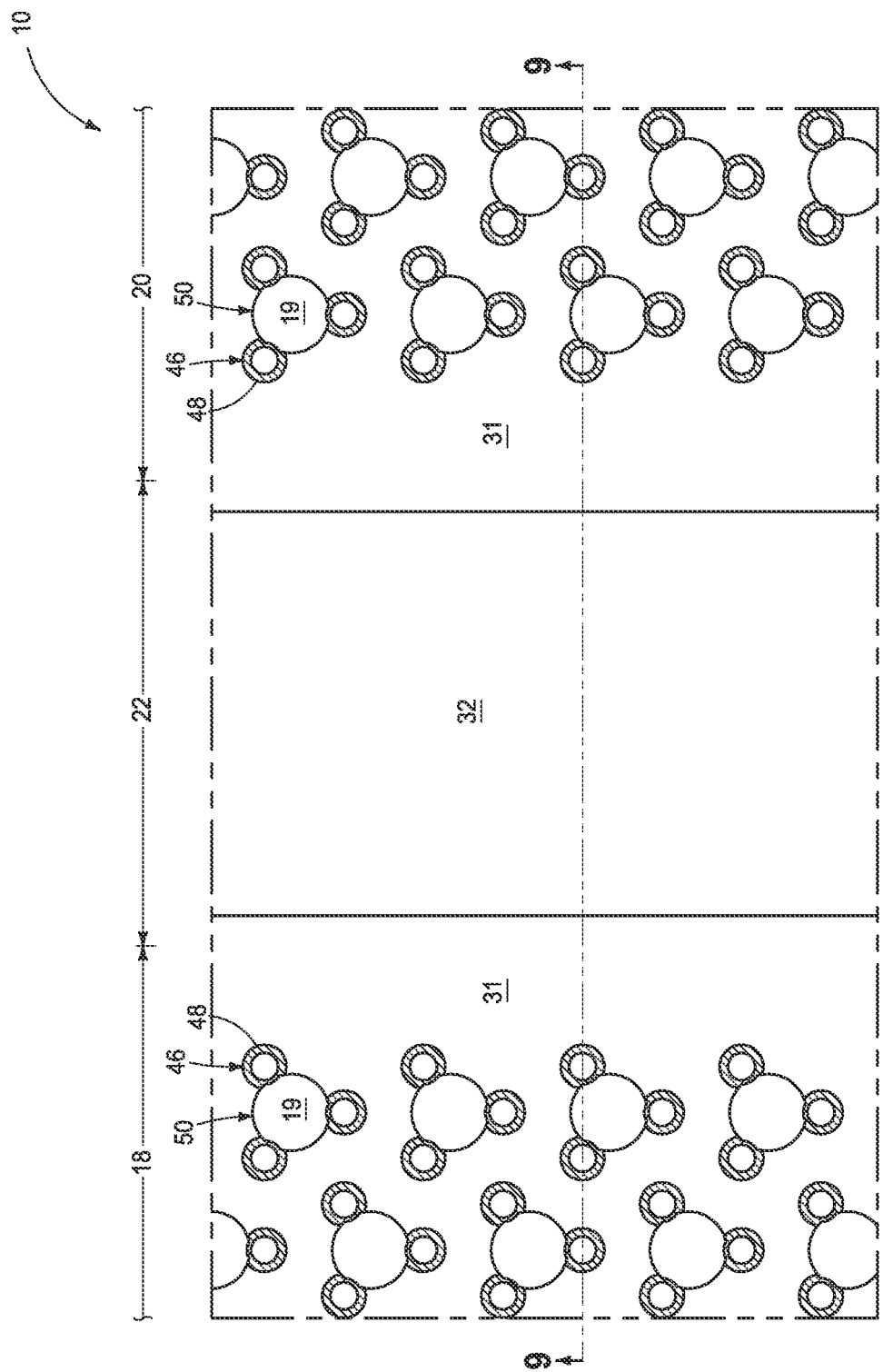
FIG. 10 is a sectional view taken through line 10-10 in FIG. 9.
Figure 11:
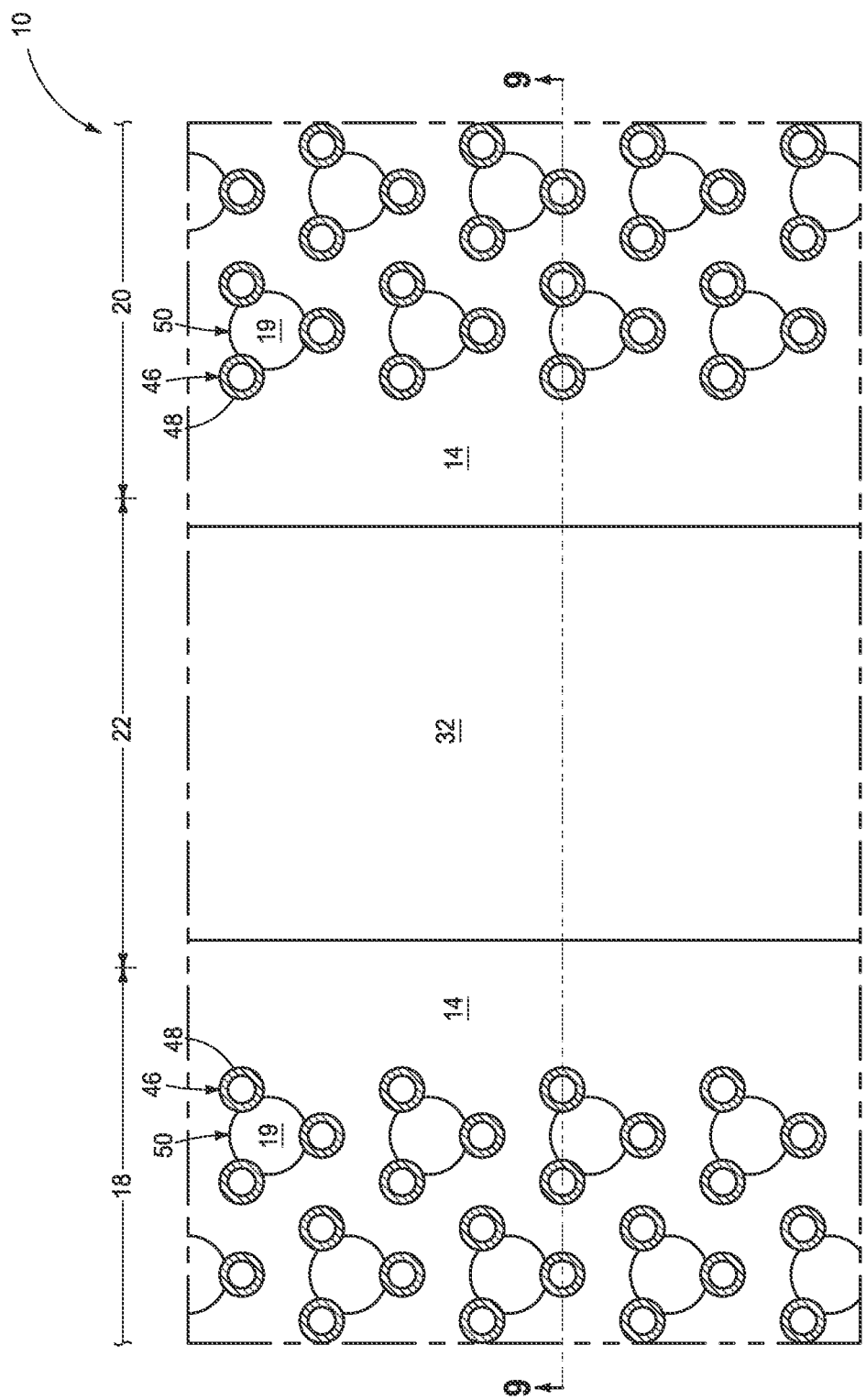
FIG. 11 is a sectional view taken through line 11-11 in FIG. 9.
Figure 18:
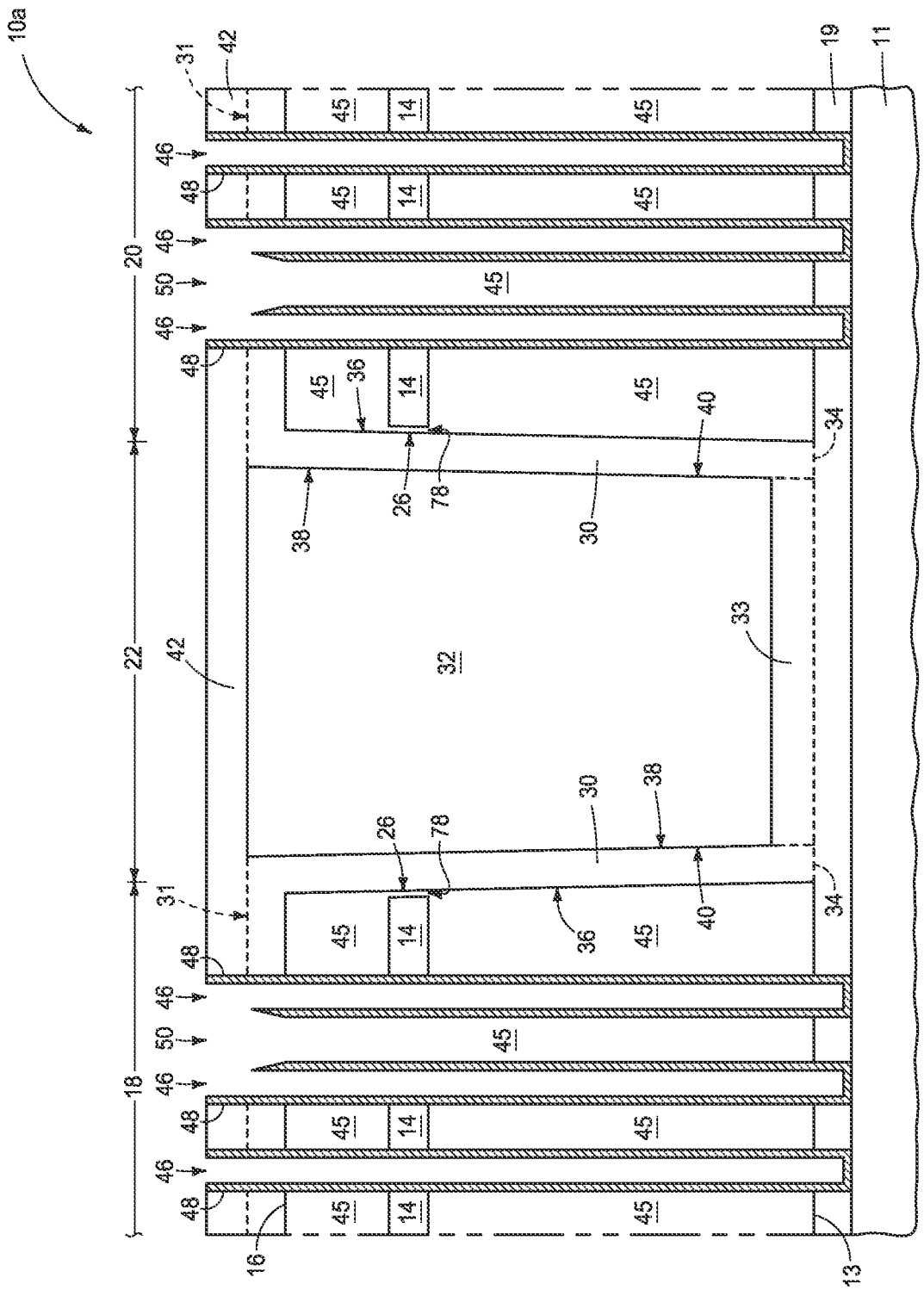
FIG. 18 is a view of the FIG. 17 construction at a processing step subsequent to that shown by FIG. 17.

FIG. 18 shows subsequent processing occurring from that of FIG. 17 through the example-processing as depicted in FIG. 9 with respect to the first described embodiments, and where material 76 (not shown) is of the same composition as that of sacrificial material 12 (also not shown in FIG. 18). Accordingly, material 76 being of the same composition as that of sacrificial material 12, such has been removed during the act of removing at least some of sacrificial material 12 (removal of all being shown) from each of two laterally-outer regions 18 and 20. Such has resulted in a void space 78 laterally-between insulator structure 14's lateral edge 26 and laterally-outer side 36 of wall 30 in each of two laterally-outer regions 18, 20.

Figure 19:
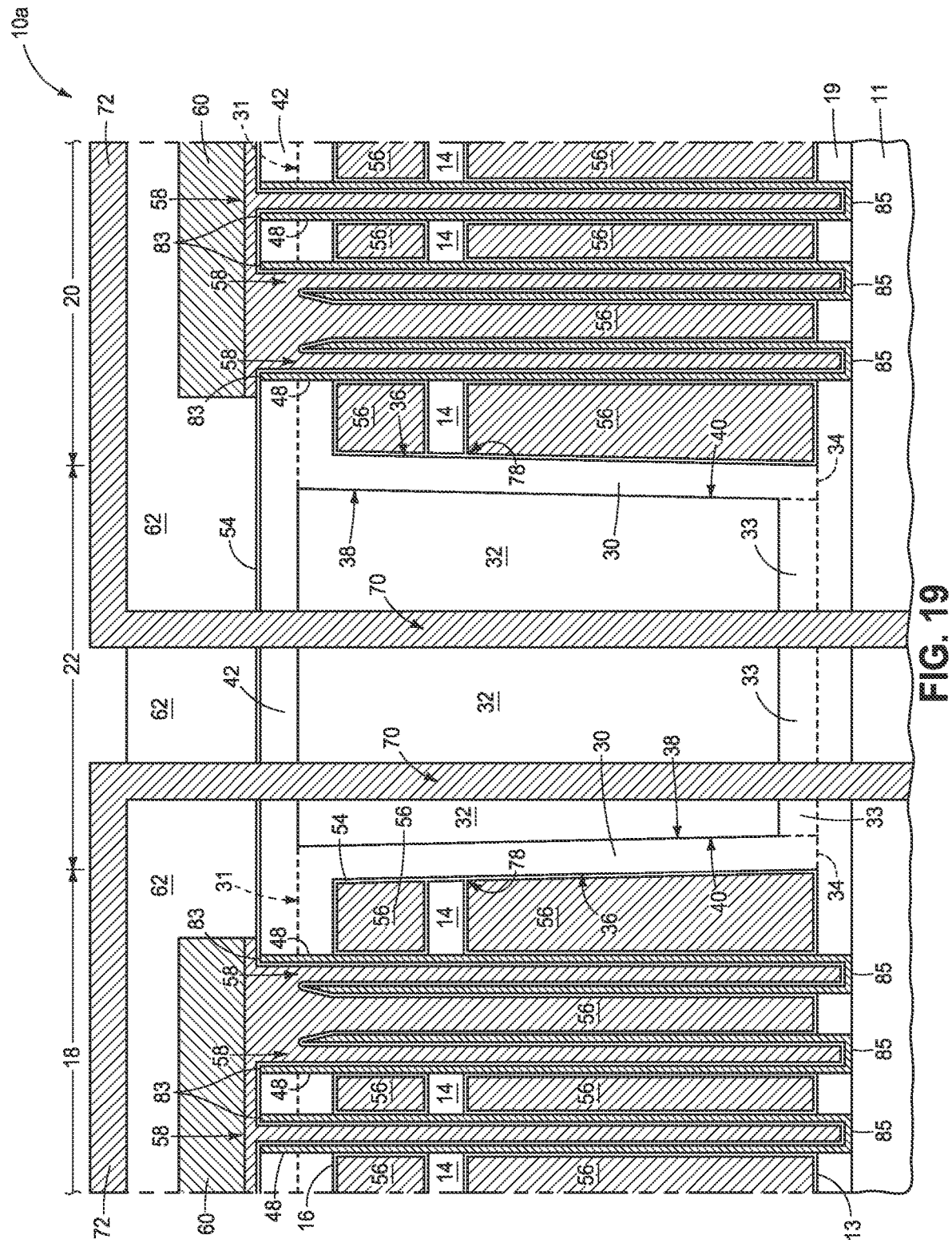
FIG. 19 is a view of the FIG. 18 construction at a processing step subsequent to that shown by FIG. 18.

FIG. 19 shows subsequent processing through the example-processing as depicted in FIG. 13 with respect to the first described embodiments where, in one example, capacitor insulator 54 has completely filled void spaces 78. Such might occur or result, if desired, by modifying lateral width of void spaces 78 the result of thickness of material 76, for example providing material 76 to be of the same or lesser thickness as material 54.

Figure 20:
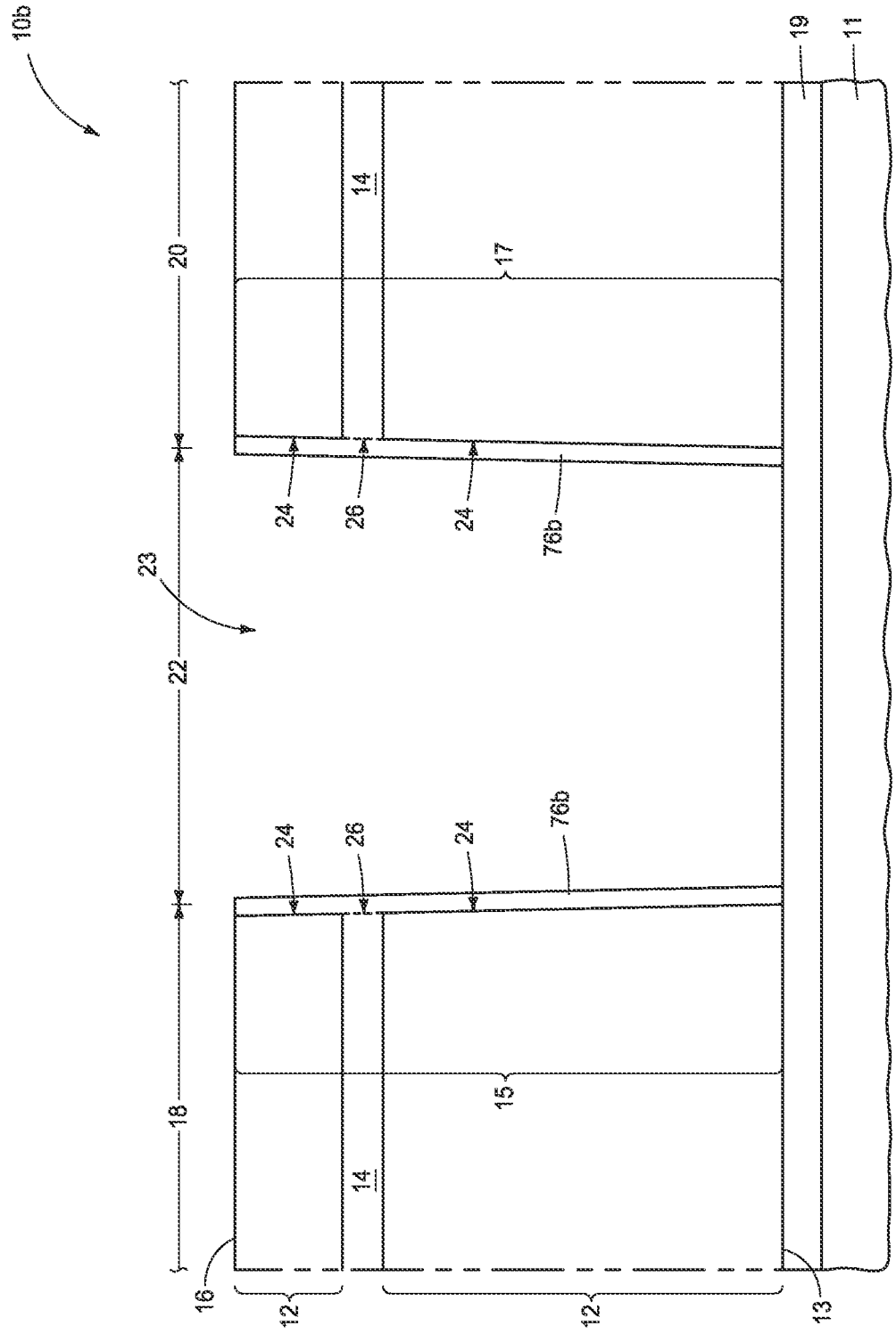
FIG. 20 is a diagrammatic cross-sectional view of a portion of a substrate construction in process in accordance with an embodiment of the invention.
Figure 21:
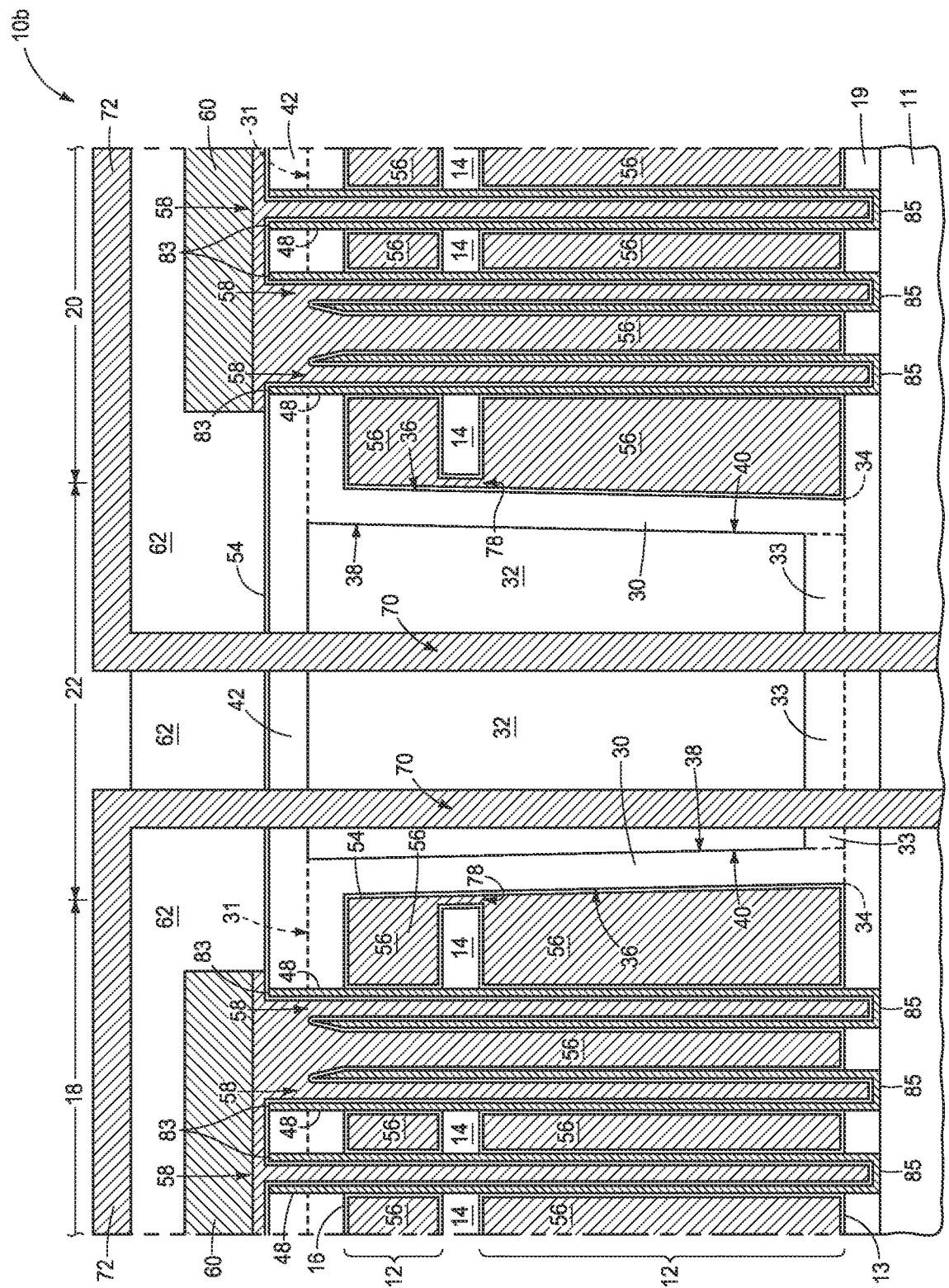
FIG. 21 is a view of the FIG. 20 construction at a processing step subsequent to that shown by FIG. 20.

Further, and for example, consider an alternate embodiment construction 10b as shown in FIGS. 20 and 21. Like numerals from the above-described embodiments have been used where appropriate, with some construction differences being indicated with the suffix "b". FIG. 20 corresponds in processing sequence to that of FIG. 17 and FIG. 21 corresponds in processing sequence to that of FIG. 19. Material 76b in FIG. 20 is shown as being deposited to be laterally thicker than material 76 of FIG. 17. Such has resulted in FIG. 21, by way of example, in two layers of capacitor insulator 54 having conductive material of shared capacitor electrode 56 sandwiched there-between in a wider void space 78b that is laterally-between lateral edge 26 and lateral-outer side 36 of wall 30. Constructions 10a and 10b are example embodiments wherein individual walls 30 are not directly against a lateral edge of insulator structure 14 that is in different ones of two laterally-outer regions 18, 20 in the vertical cross-section, and in one such embodiment (e.g., 10*b*) wherein conductive material of shared capacitor electrode 56 is between insulator-structure-lateral edges 26 and walls 30.

Figure 22:
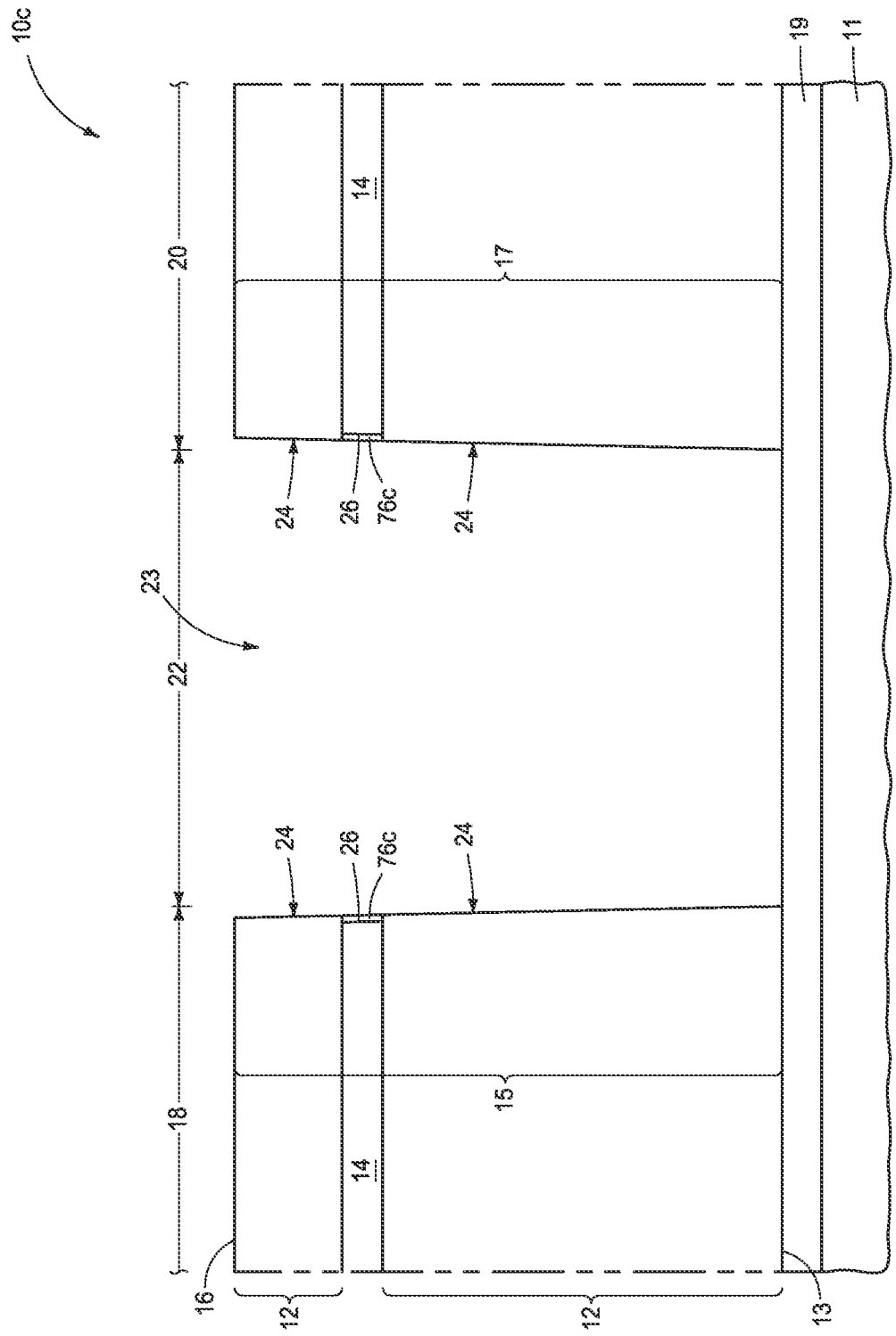
FIG. 22 is a diagrammatic cross-sectional view of a portion of a substrate construction in process in accordance with an embodiment of the invention.
Figure 23:
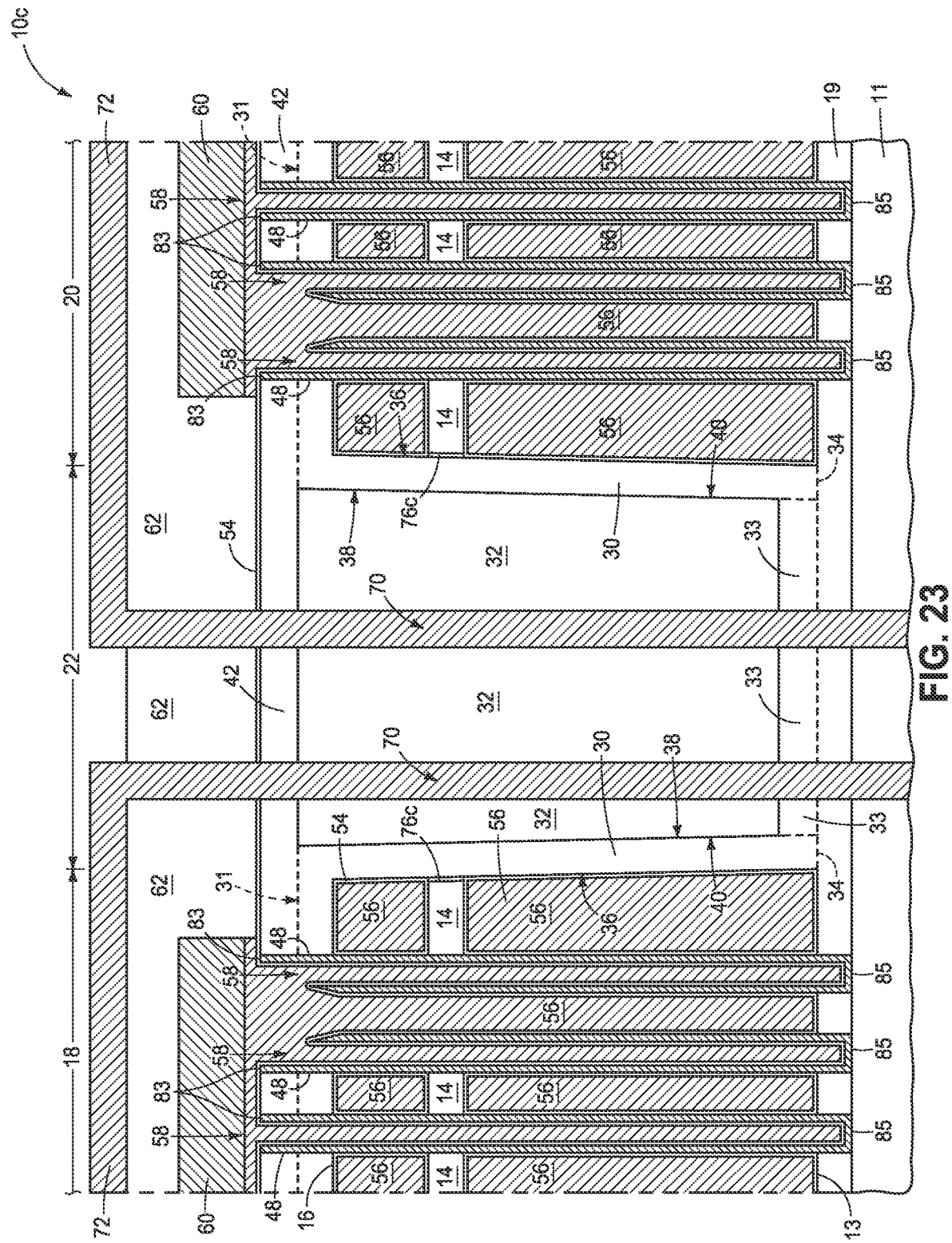
FIG. 23 is a view of the FIG. 22 construction at a processing step subsequent to that shown by FIG. 22.

Alternate example embodiments in accordance with aspects of the invention are next-described with reference to FIGS. 22 and 23 with respect to a substrate construction 10*c*. Like numerals from the above-described embodiments have been used where appropriate, with some construction differences being indicated with the suffix "c". FIG. 22 shows formation of material 76*c* that is elevationally along lateral edges 26 of insulator structure 14 and not otherwise elevationally along laterally-opposing sides 24 of opening 23 in laterally-intermediate region 22. Material 76*c* is of different composition from that of walls 30 (not-yet-formed, and therefore not shown in FIG. 22) and may be formed, for example, by a selective deposition and/or reaction of precursor components with material of insulator structure 14. As but one example, material 76*c* might comprise a silicon oxynitride formed by plasma oxidation or other oxidation of example silicon nitride material of insulator structure 14. Material 76*c* may project laterally into opening 23 (not shown) or may form solely from or by consumption of material of insulator structure 14 such that it does not project laterally into opening 23 (for example as shown), or both (not shown). Regardless, material 76*c* may remain in a finished circuitry construction as shown in FIG. 23, or may not remain in a finished circuitry construction (not shown in FIG. 23).

Figure 24:
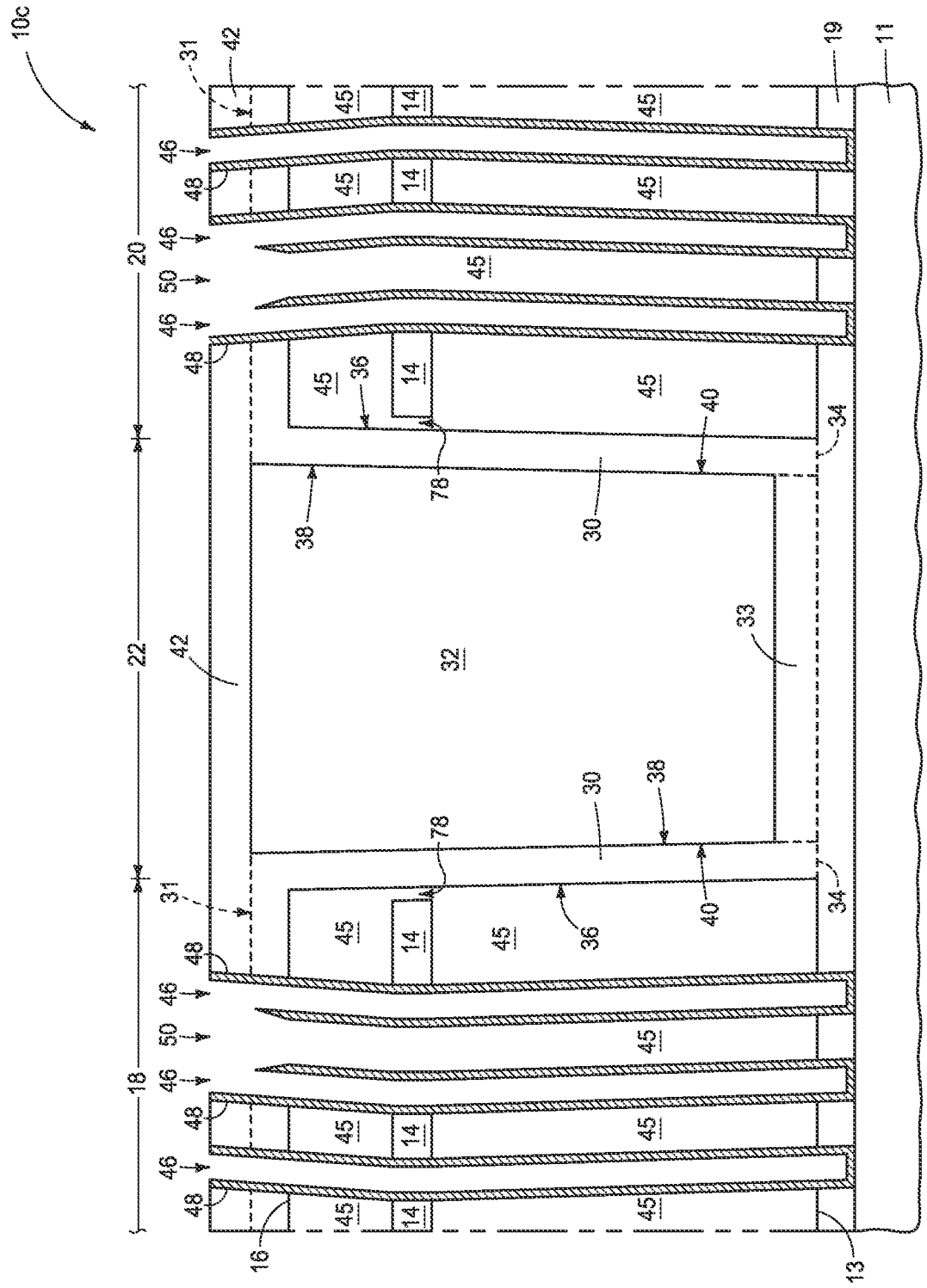
FIG. 24 is a diagrammatic cross-sectional view of a portion of a substrate construction in process in accordance with an embodiment of the invention.

FIG. 24 shows an example artifact of manufacture that may occur in embodiments of the invention, yet which were not shown in the above-described embodiments for clarity. FIG. 24 shows a construction corresponding in processing sequence to that of FIG. 18 or slightly thereafter. As an example, insulator structures 14 in regions 18 and 20 are shown to have moved laterally outward resulting in some acceptable bowing of capacitor storage node electrodes 48. Void spaces 78 may allow for some flexibility and/or lateral movement of insulator structures 14 that may alleviate stress and otherwise preclude cracking or breaking of capacitor storage node electrodes 48.

Embodiments of the invention comprise an integrated circuit construction comprising memory independent of method of manufacture, yet which may be manufactured in accordance with one or more techniques as described above. Such a construction comprises two memory-cell-array regions (e.g., 18, 20) having a peripheral-circuitry region (e.g., 22) laterally there-between in a vertical cross-section (e.g., the cross-section of any of FIG. 13, 19, 21, or 23). The two memory-cell-array regions individually comprise a plurality of capacitors (e.g., 58) individually comprising a capacitor storage node electrode (e.g., 48), a shared capacitor electrode (e.g., 56) that is shared by the plurality of capacitors, and a capacitor insulator (e.g., 54) there-between. A laterally-extending insulator structure (e.g., 14) is about lateral (e.g., radial) peripheries of the storage node electrodes and that is vertically spaced from a top (e.g., 83) and a bottom (e.g., 85) of individual of the storage node electrodes in the vertical cross-section.

The peripheral-circuitry region in the vertical cross-section comprises a pair of elevationally-extending walls (e.g., 30) comprising a first insulative composition (e.g., silicon nitride). A second insulative composition (e.g., silicon dioxide 32) different from the first insulative composition is laterally between the pair of walls. The pair of walls individually have a laterally-outer side (e.g., 36) of the first insulative composition that is directly against the capacitor insulator in different ones of the two array regions. The pair of walls individually have a laterally-inner side (e.g., 38) of the first insulative composition that is directly against different ones of two lateral sides (e.g., 40) of the second insulative composition.

In one embodiment, the capacitor insulator of different ones of the two array regions is laterally between the conductive material and a lateral edge (e.g., 26) of insulator structure 14 of different ones of the two array regions (e.g., FIGS. 19 and 21, and FIG. 23 if material 76*c* is insulative). In one embodiment, the second insulative composition is substantially chemically homogenous, and regardless in one embodiment conductive vias (e.g., 70) extend elevationally through the insulative material in the peripheral-circuitry region.

In one embodiment, the laterally-extending insulator structure has a lateral edge (e.g., 26) proximate the peripheral-circuitry region in the vertical cross-section, with such lateral edge being laterally spaced from the peripheral-circuitry region (e.g., FIGS. 19, 21, and 23). In one embodiment, conductive material of the shared capacitor electrode is laterally-between the lateral edge and the peripheral-circuitry region (e.g., FIG. 21).

In one embodiment, the pair of walls individually have a laterally-outer side (e.g., 36) of the first insulative composition that is directly against a lateral edge of the insulator structure that is in different ones of the two array regions (e.g., FIG. 13). In one such embodiment, the pair of walls individually have a laterally-inner side (e.g., 38) of the first insulative composition that is directly against different ones of two laterally-outer sides (e.g., 40) of the second insulative composition.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 450 from exactly horizontal. Further, "extend(ing) elevationally", "elevationally-extending", extend(ing) horizontally, and horizontally-extending with respect to a field effect transistor are with reference to orientation of the transistor's channel length along which current flows in operation between the source/drain regions. For bipolar junction transistors, "extend(ing) elevationally" "elevationally-extending", extend(ing) horizontally, and horizontally-extending, are with reference to orientation of the base length along which current flows in operation between the emitter and collector.

Further, "directly above" and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "under" not preceded by "directly" only requires that some portion of the stated region/material/component that is under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Additionally, "metal material" is any one or combination of an elemental metal, a mixture or an alloy of two or more elemental metals, and any conductive metal compound.

CONCLUSION

In some embodiments, a method used in the formation of integrated circuitry comprising memory comprises forming sacrificial material over a substrate and providing a laterally-extending insulator structure in the sacrificial material that is vertically spaced from a top and a bottom of the sacrificial material in a vertical cross-section. At least some of the sacrificial material and the insulator structure are removed from laterally between two laterally-outer parts of the sacrificial material and the insulator structure in the vertical cross-section to form a laterally-intermediate region laterally between two laterally-outer regions that comprise the sacrificial material and the insulator structure in the vertical cross-section. A pair of elevationally-extending walls are formed in the laterally-intermediate region that individually are against a lateral side of the sacrificial material in different ones of the two laterally-outer regions in the vertical cross-section. The sacrificial material comprises one composition and the pair of walls comprises another composition that is different from the one composition. The another composition is insulative. After forming the walls, elevationally-extending openings are formed into the sacrificial material and through the insulator structure in each of the two laterally-outer regions and capacitor storage node electrodes are formed in the openings in each of the two laterally-outer regions. After forming the capacitor storage node electrodes, at least some of the sacrificial material is removed from each of the two laterally-outer regions and then a capacitor insulator and a shared capacitor electrode are formed over the capacitor storage node electrodes in each of the two laterally-outer regions to form a plurality of capacitors in each of the two laterally-outer regions.

In some embodiments, an integrated circuit construction comprising memory comprises two memory-cell-array regions having a peripheral-circuitry region laterally therebetween in a vertical cross-section. The two memory-cell-array regions individually comprise a plurality of capacitors individually comprising a capacitor storage node electrode, a shared capacitor electrode that is shared by the plurality of capacitors, and a capacitor insulator there-between. A laterally-extending insulator structure is about lateral peripheries of the capacitor storage node electrodes and is vertically spaced from a top and a bottom of individual of the capacitor storage node electrodes in the vertical cross-section. The peripheral-circuitry region in the vertical cross-section comprises a pair of elevationally-extending walls comprising a first insulative composition. A second insulative composition different from the first insulative composition is laterally between the pair of walls. The pair of walls individually have a laterally-outer side of the first insulative composition that is directly against the capacitor insulator in different ones of the two array regions. The pair of walls individually have a laterally-inner side of the first insulative composition that is directly against different ones of two lateral sides of the second insulative composition.

In some embodiments, an integrated circuit construction comprising memory comprises a memory-cell-array region and a peripheral-circuitry region laterally adjacent thereto in a vertical cross-section. The memory-cell-array region comprises a plurality of capacitors individually comprising a capacitor storage node electrode, a shared capacitor electrode that is shared by the plurality of capacitors, and a capacitor insulator there-between. A laterally-extending insulator structure is about lateral peripheries of the capacitor storage node electrodes and is vertically spaced from a top and a bottom of individual of the capacitor storage node electrodes in the vertical cross-section. The laterally-extending insulator structure has a lateral edge proximate the peripheral-circuitry region in the vertical cross-section. The lateral edge is laterally spaced from the peripheral circuitry region. Conductive material of the shared capacitor electrode is laterally between the lateral edge and the peripheral-circuitry region.

In some embodiments, an integrated circuit construction comprising memory comprises two memory-cell-array regions having a peripheral-circuitry region laterally there-between in a vertical cross-section. The two memory-cell-array regions individually comprise a plurality of capacitors individually comprising a capacitor storage node electrode, a shared capacitor electrode that is shared by the plurality of capacitors, and a capacitor insulator there-between. A laterally-extending insulator structure is about lateral peripheries of the capacitor storage node electrodes and is vertically spaced from a top and a bottom of individual of the capacitor storage node electrodes in the vertical cross-section. The peripheral-circuitry region in the vertical cross-section comprises a pair of elevationally-extending walls comprising a first insulative composition. A second insulative composition different from the first insulative composition is laterally between the pair of walls. The pair of walls individually have a laterally-outer side of the first insulative composition that is directly against a lateral edge of the insulator structure that is in different ones of the two array regions.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. An integrated circuit construction comprising memory, comprising:
   two memory-cell-array regions having a peripheral-circuitry region laterally there-between in a vertical cross-section, the two memory-cell-array regions individually comprising:
      a plurality of capacitors individually comprising a capacitor storage node electrode, a shared capacitor electrode that is shared by the plurality of capacitors, and a capacitor insulator there-between; and
      a laterally-extending insulator structure that is about lateral peripheries of the capacitor storage node electrodes and that is vertically spaced from a top and a bottom of individual of the capacitor storage node electrodes in the vertical cross-section; and
   the peripheral-circuitry region in the vertical cross-section comprising:
      a pair of elevationally-extending walls comprising a first insulative composition;
      a second insulative composition different from the first insulative composition laterally between the pair of walls; and
      the pair of walls individually having a laterally-outer side of the first insulative composition that is directly against the capacitor insulator in different ones of the two array regions, the pair of walls individually having a laterally-inner side of the first insulative composition that is directly against different ones of two lateral sides of the second insulative composition.

2. The integrated circuit construction of claim 1 wherein the capacitor insulator of different ones of the two array regions is laterally between a conductive material of the shared capacitor electrode and a lateral edge of the insulator structure of different ones of the two array regions.

3. The integrated circuit construction of claim 1 wherein the second insulative composition is substantially chemically homogenous.

4. The integrated circuit construction of claim 1 comprising conductive vias extending elevationally through the insulative material in the peripheral-circuitry region.

5. An integrated circuit construction comprising memory, comprising:
   a memory-cell-array region and a peripheral-circuitry region laterally adjacent thereto in a vertical cross-section, the memory-cell-array region comprising:
      a plurality of capacitors individually comprising a capacitor storage node electrode comprising conducting material, a shared capacitor electrode comprising conductive material that is shared by the plurality of capacitors, and a capacitor insulator there-between, the conducting material of individual of the capacitor storage node electrodes not being continuous among multiple of the capacitor storage node electrodes, the conductive material of the shared capacitor electrode being continuous among the multiple of the capacitor storage node electrodes; and
      a laterally-extending insulator structure that is about lateral peripheries of the capacitor storage node electrodes and that is vertically spaced from a top and a bottom of individual of the capacitor storage node electrodes in the vertical cross-section; and
   the laterally-extending insulator structure having a lateral edge proximate the peripheral-circuitry region in the vertical cross-section, the lateral edge being laterally spaced from the peripheral circuitry region, the conductive material of the shared capacitor electrode that is continuous among the multiple of the capacitor storage node electrodes being laterally between the lateral edge and the peripheral-circuitry region.

6. An integrated circuit construction comprising memory, comprising:
   two memory-cell-array regions having a peripheral-circuitry region laterally there-between in a vertical cross-section, the two memory-cell-array regions individually comprising:
      a plurality of capacitors individually comprising a capacitor storage node electrode, a shared capacitor electrode that is shared by the plurality of capacitors, and a capacitor insulator there-between; and
      a laterally-extending insulator structure that is about lateral peripheries of the capacitor storage node electrodes and that is vertically spaced from a top and a bottom of individual of the capacitor storage node electrodes in the vertical cross-section; and
   the peripheral-circuitry region in the vertical cross-section comprising:
      a pair of elevationally-extending walls comprising a first insulative composition;
      a second insulative composition different from the first insulative composition laterally between the pair of walls; and
      the pair of walls individually having a laterally-outer side of the first insulative composition that is directly against a lateral edge of the insulator structure that is in different ones of the two array regions.

7. The integrated circuit construction of claim 6 wherein the pair of walls individually have a laterally-inner side of the first insulative composition that is directly against different ones of two laterally-outer sides of the second insulative composition.

8. An integrated circuit construction comprising memory, comprising:
- a memory-cell-array region and a peripheral-circuitry region laterally adjacent thereto in a vertical cross-section, the memory-cell-array region comprising:
  - a plurality of capacitors individually comprising a capacitor storage node electrode, a shared capacitor electrode that is shared by the plurality of capacitors, and a capacitor insulator there-between; and
  - a laterally-extending insulator structure that is about lateral peripheries of the capacitor storage node electrodes and that is vertically spaced from a top and a bottom of individual of the capacitor storage node electrodes in the vertical cross-section; and
  - the laterally-extending insulator structure having a lateral edge proximate the peripheral-circuitry region in the vertical cross-section, the lateral edge being laterally spaced from the peripheral circuitry region, conductive material of the shared capacitor electrode being laterally between the lateral edge and the peripheral-circuitry region, the laterally-extending insulator structure being continuous among multiple of the capacitor storage node electrodes.

* * * * *